United States Patent
Chung et al.

(10) Patent No.: US 10,043,803 B2
(45) Date of Patent: Aug. 7, 2018

(54) SEMICONDUCTOR DEVICE HAVING GATE ELECTRODES WITH STACKED METAL LAYERS

(71) Applicant: Samsung Electronics Co., Ltd., Suwon-si (KR)

(72) Inventors: Wonkeun Chung, Seoul (KR); Gigwan Park, Hwaseong-si (KR); Huyong Lee, Seoul (KR); TaekSoo Jeon, Yongin-si (KR); Sangjin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/372,876

(22) Filed: Dec. 8, 2016

(65) Prior Publication Data

US 2017/0186746 A1    Jun. 29, 2017

(30) Foreign Application Priority Data

Dec. 29, 2015 (KR) .................. 10-2015-0188734

(51) Int. Cl.
| | |
|---|---|
| *H01L 29/06* | (2006.01) |
| *H01L 29/43* | (2006.01) |
| *H01L 29/49* | (2006.01) |
| *H01L 27/092* | (2006.01) |
| *H01L 29/423* | (2006.01) |

(52) U.S. Cl.
CPC ...... *H01L 27/0922* (2013.01); *H01L 29/0649* (2013.01); *H01L 29/42364* (2013.01); *H01L 29/42376* (2013.01); *H01L 29/435* (2013.01); *H01L 29/495* (2013.01); *H01L 29/4958* (2013.01)

(58) Field of Classification Search
CPC ............ H01L 27/0922; H01L 29/0649; H01L 29/42364; H01L 29/42376; H01L 29/435; H01L 29/495–29/4958
See application file for complete search history.

(56) References Cited

U.S. PATENT DOCUMENTS

| | | | | |
|---|---|---|---|---|
| 7,682,891 B2* | 3/2010 | Lavoie | ............ | H01L 21/823842 257/E29.255 |
| 8,084,824 B2* | 12/2011 | Yu | .................. | H01L 21/823807 257/288 |
| 8,507,979 B1* | 8/2013 | Huang | .............. | H01L 29/66477 257/330 |
| 8,624,327 B2* | 1/2014 | Hung | ..................... | H01L 27/11 257/334 |

(Continued)

FOREIGN PATENT DOCUMENTS

| | | |
|---|---|---|
| JP | 07183315 | 7/1995 |
| KR | 100307537 | 11/2001 |

(Continued)

*Primary Examiner* — Ida M Soward
(74) *Attorney, Agent, or Firm* — Onello & Mello, LLP

(57) ABSTRACT

A semiconductor device includes a substrate having an active pattern thereon, a gate electrode intersecting the active pattern, and a spacer on a sidewall of the gate electrode. The gate electrode includes a first metal pattern adjacent to the active pattern. The first metal pattern has a first portion parallel to the sidewall and a second portion parallel to the substrate. A top surface of the first portion has a descent in a direction from the spacer towards the second portion.

16 Claims, 39 Drawing Sheets

(56) References Cited

U.S. PATENT DOCUMENTS

| | | | | |
|---|---|---|---|---|
| 8,642,457 B2* | 2/2014 | Fu | .................. | H01L 21/823857 257/E21.158 |
| 8,674,452 B2* | 3/2014 | Chien | ............. | H01L 21/823842 257/368 |
| 8,940,626 B2* | 1/2015 | Xie | ...................... | H01L 27/092 257/331 |
| 8,962,415 B2* | 2/2015 | Lee | .................. | H01L 21/28105 257/E21.632 |
| 9,087,886 B2* | 7/2015 | Kim | .................. | H01L 21/02697 |
| 9,240,453 B2 | 1/2016 | Oh | | |
| 9,257,348 B2* | 2/2016 | Xie | ..................... | H01L 29/6656 |
| 9,287,181 B2* | 3/2016 | Tseng | ............. | H01L 21/823857 |
| 9,287,263 B1* | 3/2016 | Hsu | .................. | H01L 29/66545 |
| 9,305,922 B2* | 4/2016 | Kim | ................ | H01L 21/823885 |
| 9,312,376 B2 | 4/2016 | Kim et al. | | |
| 9,349,731 B2* | 5/2016 | Kim | .................. | H01L 21/76801 |
| 9,425,103 B2* | 8/2016 | Xie | .................. | H01L 21/28088 |
| 9,496,361 B1* | 11/2016 | Tung | .................. | H01L 29/4958 |
| 9,524,965 B2* | 12/2016 | Ho | ....................... | H01L 27/088 |
| 9,640,534 B2* | 5/2017 | Kim | ..................... | H01L 27/092 |
| 2006/0278934 A1* | 12/2006 | Nagahama | ...... | H01L 21/823842 257/369 |
| 2014/0106557 A1* | 4/2014 | Fu | ..................... | H01L 21/28088 438/592 |
| 2015/0311208 A1* | 10/2015 | Kim | .................. | H01L 21/02697 257/369 |
| 2015/0371989 A1* | 12/2015 | Kim | .................. | H01L 21/76801 257/369 |
| 2016/0071944 A1* | 3/2016 | Lu | ..................... | H01L 29/42376 257/392 |
| 2016/0284703 A1* | 9/2016 | Kim | .................... | H01L 27/0886 |
| 2016/0343706 A1* | 11/2016 | Chang | ................. | H01L 27/0886 |
| 2016/0372377 A1* | 12/2016 | Mukherjee | ...... | H01L 21/823456 |
| 2016/0372382 A1 | 12/2016 | Lee et al. | | |
| 2017/0133274 A1* | 5/2017 | Lu | ..................... | H01L 21/02164 |

FOREIGN PATENT DOCUMENTS

| | | |
|---|---|---|
| KR | 1020160126485 | 11/2016 |
| KR | 20160148795 | 12/2016 |
| KR | 1020170046347 | 5/2017 |

\* cited by examiner

SEMICONDUCTOR DEVICE HAVING GATE ELECTRODES WITH STACKED METAL LAYERS

CROSS-REFERENCE TO RELATED APPLICATION

This application claims priority under 35 U.S.C. § 119 from Korean Patent Application No. 10-2015-0188734, filed on Dec. 29, 2015, the disclosure of which is hereby incorporated by reference in its entirety.

BACKGROUND

Embodiments of the inventive concepts relate to a semiconductor device and a method for manufacturing the same and, more particularly, to a semiconductor device including a field effect transistor and a method for manufacturing the same.

Semiconductor devices are widely used in the electronic industry because of their small sizes, multi-functional characteristics, and low manufacture costs. Semiconductor devices may be categorized as any one of semiconductor memory devices storing logical data, semiconductor logic devices processing logic data, and hybrid semiconductor devices having both the function of the semiconductor memory devices and the function of the semiconductor logic devices. Semiconductor devices with excellent characteristics have been increasingly demanded by the electronic industry. For example, desired characteristics include high-reliability, high-speed, and multi-functional semiconductor devices. To satisfy these demands, semiconductor devices have required higher levels of integration necessitating more complicated device structures.

SUMMARY

Embodiments of the inventive concepts may provide a semiconductor device including a field effect transistor with improved electrical characteristics.

Embodiments of the inventive concepts may also provide a method for manufacturing a semiconductor device including a field effect transistor with improved electrical characteristics.

In one aspect, the present inventive concepts are directed to a semiconductor device including a substrate having an active pattern thereon, a gate electrode intersecting the active pattern, and a spacer on a sidewall of the gate electrode. The gate electrode comprises a first metal pattern adjacent to the active pattern. The first metal pattern has a first portion parallel to the sidewall and a second portion parallel to the substrate. A top surface of the first portion has a descent in a direction from the spacer toward the second portion.

In another aspect, the present inventive concepts are directed to a semiconductor device comprising a substrate having a first active pattern and a second active pattern thereon, a first gate electrode and a second gate electrode intersecting the first active pattern and the second active pattern, respectively, and a first spacer and a second spacer on a sidewall of the first gate electrode and a sidewall of the second gate electrode, respectively. The first and second gate electrodes include first and second metal patterns in lower portions of the first and second gate electrodes, respectively. The first metal pattern includes a first portion adjacent to the first spacer, and the second metal pattern includes a second portion adjacent to the second spacer. An average level of a top surface of the first portion is different from an average level of a top surface of the second portion.

In another aspect, the present inventive concepts are directed to a semiconductor device comprising a substrate having a first active pattern and a second active pattern thereon, a first gate electrode and a second gate electrode intersecting the first active pattern and the second active pattern, respectively. The first gate electrode comprises a first metal pattern in a lower portion of the first gate electrode, and a second metal pattern covering a top surface of the first metal pattern. The second gate electrode comprises a third metal pattern in a lower portion of the second gate electrode, and a fourth metal pattern covering a top surface of the third metal pattern. A level of a bottom surface of the second metal pattern is different from a level of a bottom surface of the fourth metal pattern. The first active pattern and the first gate electrode comprise a first transistor, and the second active pattern and the second gate electrode comprise a second transistor. A respective channel region of the first and second transistors have the same conductivity type, and a threshold voltage of the first transistor is different from a threshold voltage of the second transistor.

In another aspect, the present inventive concepts are directed to a method for manufacturing a semiconductor device comprising forming a first sacrificial gate pattern intersecting a first active pattern of a substrate, forming a pair of first spacers on both sidewalls of the first sacrificial gate pattern, removing the first sacrificial gate pattern to form a first gate trench defined by the pair of first spacers, forming a first metal layer and a first dummy filler layer on the first metal layer in the first gate trench, and etching the first metal layer using the first dummy filler layer as an etch mask to form a first metal pattern. The first metal pattern includes a first portion between the first dummy filler layer and the first spacer. A top surface of the first portion is formed to have a descent in a direction from the first spacer toward the first dummy filler layer.

In another aspect, the present inventive concepts are directed to a semiconductor device comprising a plurality of gates formed on a substrate. Each gate includes a plurality of metal layers. Each metal layer has a center portion parallel to the substrate. The center portion bisects a pair of side portions orthogonal to the center portion. Each of the side portions has a respective top with a taper. A first metal layer is separated from the substrate by a gate dielectric. A second metal layer is on the first metal layer. A first region of the substrate includes a first one of the plurality of gates. A second region of the substrate includes a second one of the plurality of gates.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which:

FIG. 4A to FIG. 9A are perspective views illustrating embodiments of the inventive concepts at sequential steps of manufacturing a semiconductor device.

FIG. 4B to FIG. 9B are cross-sectional views of FIG. 4A to FIG. 9A respectively, taken along lines I-I' and II-II'.

DETAILED DESCRIPTION

Figure 1:
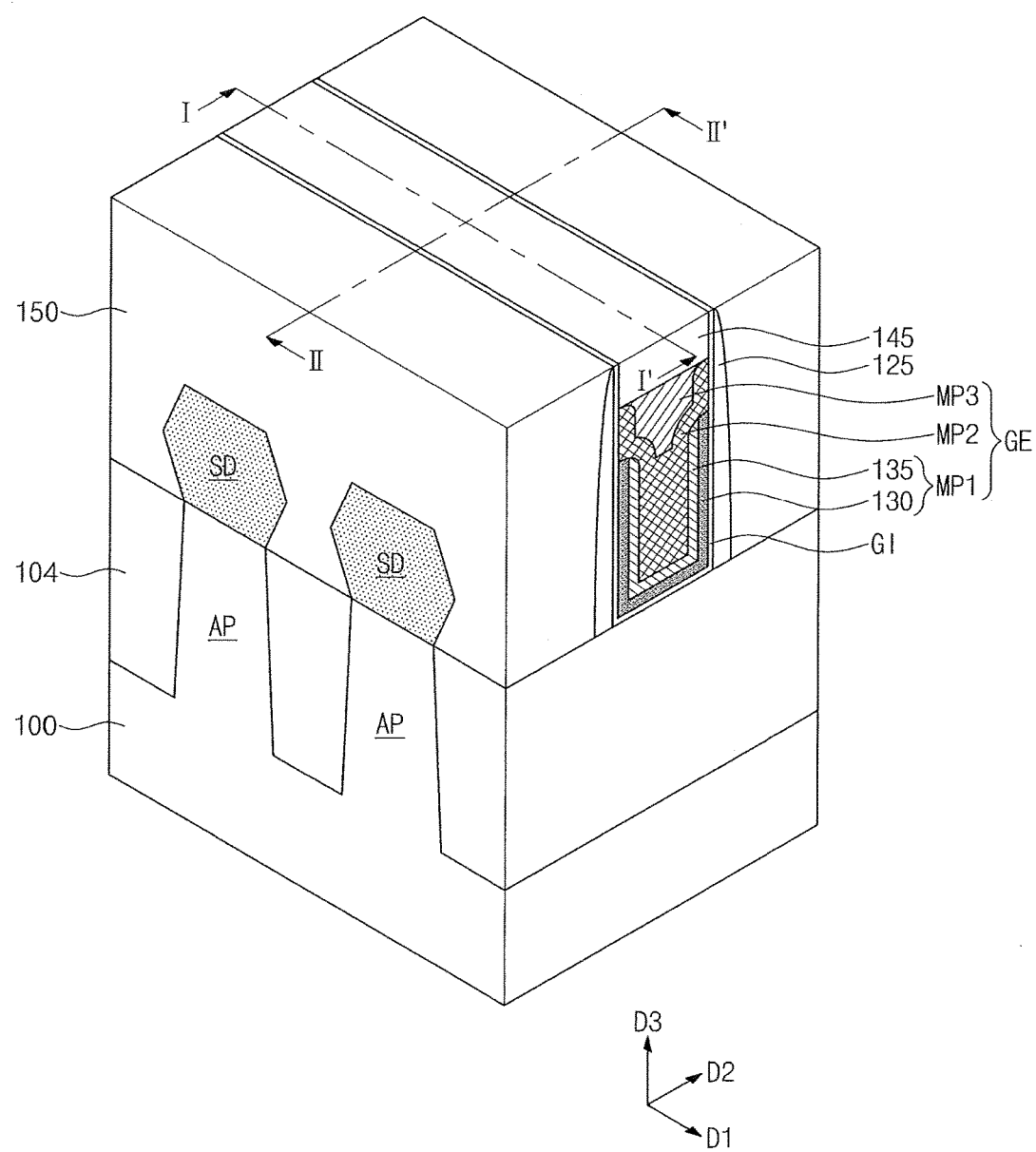
FIG. 1 is a perspective view of a semiconductor device according to embodiments of the inventive concepts.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

Figure 2:
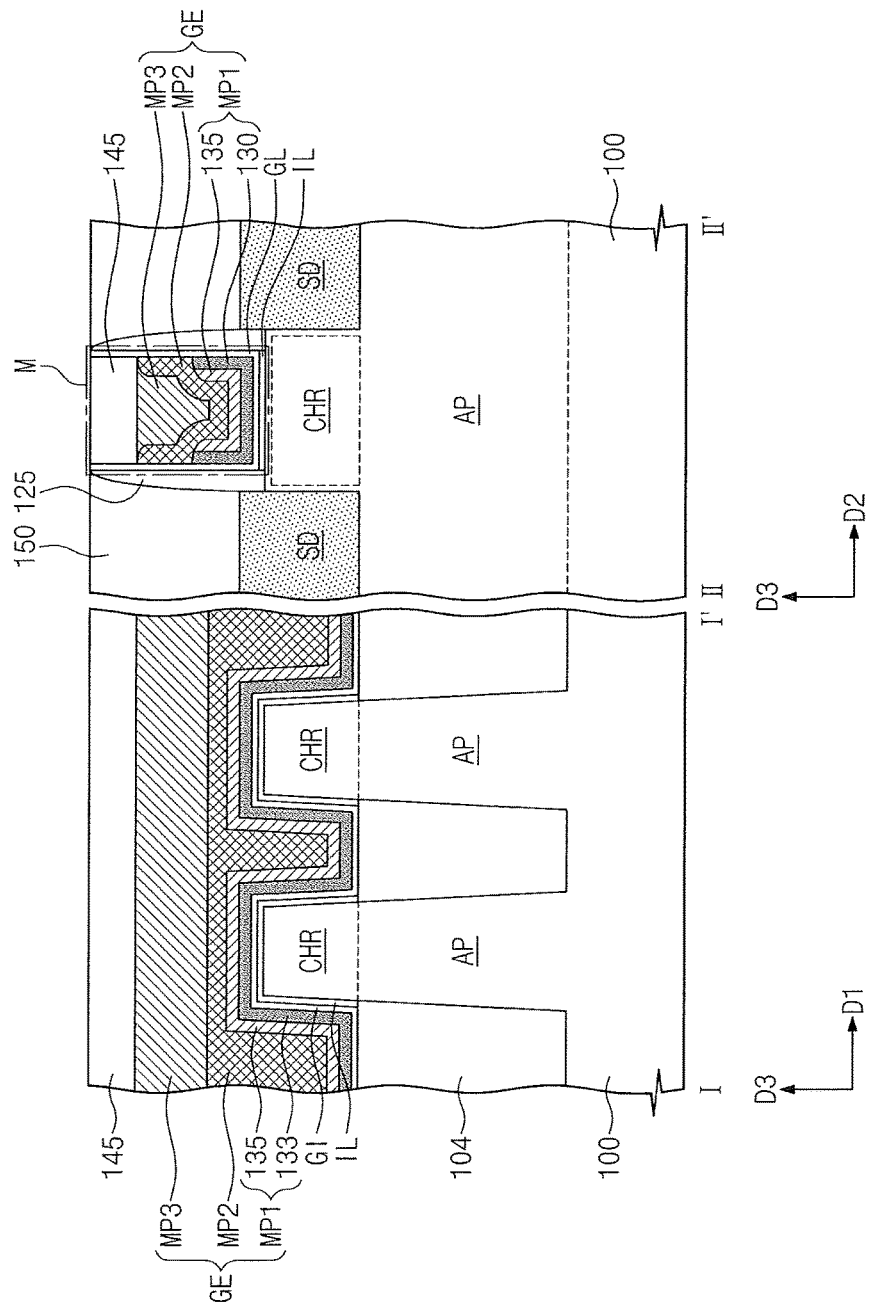
FIG. 2 is a cross-sectional view of FIG. 1 taken along lines I-I' and II-II'.

FIG. 1 is a perspective view of a semiconductor device according to embodiments of the inventive concepts. FIG. 2 is a cross-sectional view of FIG. 1 taken along lines I-I' and II-II'.

Referring to FIG. 1 and FIG. 2, device isolation layers 104 may be disposed in a substrate 100 to define a plurality of active patterns AP. The device isolation layers 104 may be formed in an upper portion of the substrate 100. For example, the substrate 100 may be a semiconductor substrate including silicon, germanium, silicon-germanium or a compound semiconductor substrate. The device isolation layers 104 may include an insulating material such as silicon oxide.

The active patterns AP may extend parallel to a top surface of the substrate 100 in one or more directions including a second direction D2, and a first direction D1 intersecting the second direction D2. The active patterns AP may have a first conductivity type. The active patterns AP may be disposed in a memory region or a non-memory region of the semiconductor device according to some embodiments of the inventive concepts. For example, the memory region may include a static random access memory (SRAM) region, a dynamic random access memory (DRAM) region, a magnetic random access memory (MRAM) region, a resistive random access memory (RRAM) region, or a phase-change random access memory (PRAM) region, and the non-memory region may include a logic region.

Upper portions of the active patterns AP may protrude with respect to the device isolation layers 104. Specifically, the upper portions of the active patterns AP may protrude from the device isolation layers 104 in a third direction D3 substantially perpendicular to the top surface of the substrate 100. The protruding upper portions of the active patterns AP may have a fin-shape. Each of the upper portions of the active patterns AP may include a source or drain pattern SD and a channel region CHR disposed between each pair of source and drain patterns SD.

A gate electrode GE intersecting the active patterns AP may be disposed on the substrate 100. The gate electrode GE may vertically overlap the channel regions CHR of the active patterns AP. In other words, the gate electrode GE may have a linear shape that extends in the first direction D1 to intersect the active patterns AP protruding from the device isolation layers 104.

A pair of gate spacers 125 may be disposed on both sidewalls of the gate electrode GE. The gate spacers 125 may extend along the gate electrode GE in the first direction D1. Top ends of the gate spacers 125 may be higher than a top surface of the gate electrode GE. In addition, the top ends of the gate spacers 125 may be substantially coplanar with a top surface of an interlayer insulating layer 150. For example, the gate spacers 125 may include at least one of $SiO_2$, SiCN, SiCON, or SiN. In particular, each of the gate spacers 125 may have a multi-layered structure including at least two selected from a group consisting of $SiO_2$, SiCN, SiCON, and SiN.

A gate dielectric pattern GI may be disposed between the gate electrode GE and both the substrate 100 and the active pattern AP. The gate dielectric pattern GI may be further disposed between the gate electrode GE and the gate spacers 125. The gate dielectric pattern GI may extend along a bottom surface of the gate electrode GE. Thus, the gate dielectric pattern GI may partially cover a top surface of the device isolation layer 104 disposed between adjacent active patterns AP. The top surfaces of the device isolation layers 104 may have portions that are not covered by the gate dielectric pattern GI. The portions of top surfaces of the device isolation layers 104, which are not covered by the gate dielectric pattern 104, may be covered by the interlayer insulating layer 150.

The gate dielectric pattern GI may include a high-K dielectric material. For example, the high-K dielectric material may include at least one of Hafnium Oxide, Hafnium-Silicon Oxide, Lanthanum Oxide, Zirconium Oxide, Zirconium-Silicon Oxide, Tantalum Oxide, Titanium Oxide, Barium-Strontium-Titanium Oxide, Barium-Titanium Oxide, Strontium-Titanium Oxide, Lithium Oxide, Aluminum Oxide, Lead-Scandium-Tantalum Oxide, or Lead-Zinc Niobate.

Interface patterns IL may be disposed between the gate dielectric pattern GI and the active patterns AP. Each of the interface patterns IL may directly cover a top surface and sidewalls of each of the channel regions CHR. The interface patterns IL may stabilize the interfaces between the gate dielectric pattern GI and the active patterns AP. In contrast to the gate dielectric pattern GI, the interface patterns IL may not extend onto the device isolation layer 104 but may be spaced apart from each other in the first direction D1. In addition, the interface patterns IL may not be disposed between the gate electrode GE and the gate spacers 125. Thus, the gate dielectric pattern GI may be in direct contact with sidewalls (e.g., inner sidewalls) of the gate spacers 125. The interface patterns IL may include at least one of $SiO_2$ or SiON.

A protection pattern 145 may be disposed on the gate electrode GE. The protection pattern 145 may extend along the gate electrode GE in the first direction D1. The protection pattern 145 may include a material having an etch selectivity with respect to the interlayer insulating layer 150 to be described later. For example, the protection pattern 145 may include at least one of SiON, SiCN, SiCON, or SiN.

The source and drain patterns SD may be disposed in the upper portion of the active pattern AP on either side of the gate electrode GE. In some embodiments, the source and drain patterns SD may include epitaxial patterns. For example, the upper portion of the active pattern AP at both sides of the gate electrode GE may be recessed, and the epitaxial patterns may be grown from the recessed surfaces of the active pattern AP by an epitaxial growth process. In some embodiments, top surfaces of the source and drain patterns SD may be disposed at substantially the same level as, or higher than, the top surfaces of the channel regions CHR.

The source and drain patterns SD may include a different semiconductor element from the substrate 100. In some embodiments, the source and drain patterns SD may include a semiconductor element of which a lattice constant is greater or smaller than that of the semiconductor element of the substrate 100. Since the source and drain patterns SD include the different semiconductor element from the substrate 100, the source and drain patterns SD may provide compressive stress or tensile stress to the channel regions CHR. In some embodiments, where the substrate 100 is a silicon substrate, the source and drain patterns SD may include SiGe or germanium (Ge). In this case, the source and drain patterns SD may provide the compressive stress to the channel regions CHR, and a field effect transistor including the source and drain patterns SD may be a PMOS field effect transistor (PMOSFET or PFET). In certain embodiments, where the substrate 100 is a silicon substrate, the source and drain patterns SD may include Silicon Carbide (SiC). In this case, the source and drain patterns SD may provide the tensile stress to the channel regions CHR, and the field effect transistor including the source and drain patterns SD may be an NMOS field effect transistor (NMOSFET or NFET). Because the source and drain patterns SD provide the compressive stress or the tensile stress to the channel regions CHR, the mobility of carriers may be improved in the channel regions CHR when the field effect transistor is operated. The source and drain patterns SD may have a second conductivity type that is different from the first conductivity type of the active patterns AP.

The interlayer insulating layer 150 may be disposed on the substrate 100. The interlayer insulating layer 150 may cover sidewalls (e.g., outer sidewalls) of the gate spacers 125 and the source and drain patterns SD. The top surface of the interlayer insulating layer 150 may be substantially coplanar with a top surface of the protection pattern 145. In addition, contacts (not shown) may penetrate the interlayer insulating layer 150 to be electrically connected to the source and drain patterns SD at either side of the gate electrode GE.

Figure 3A:
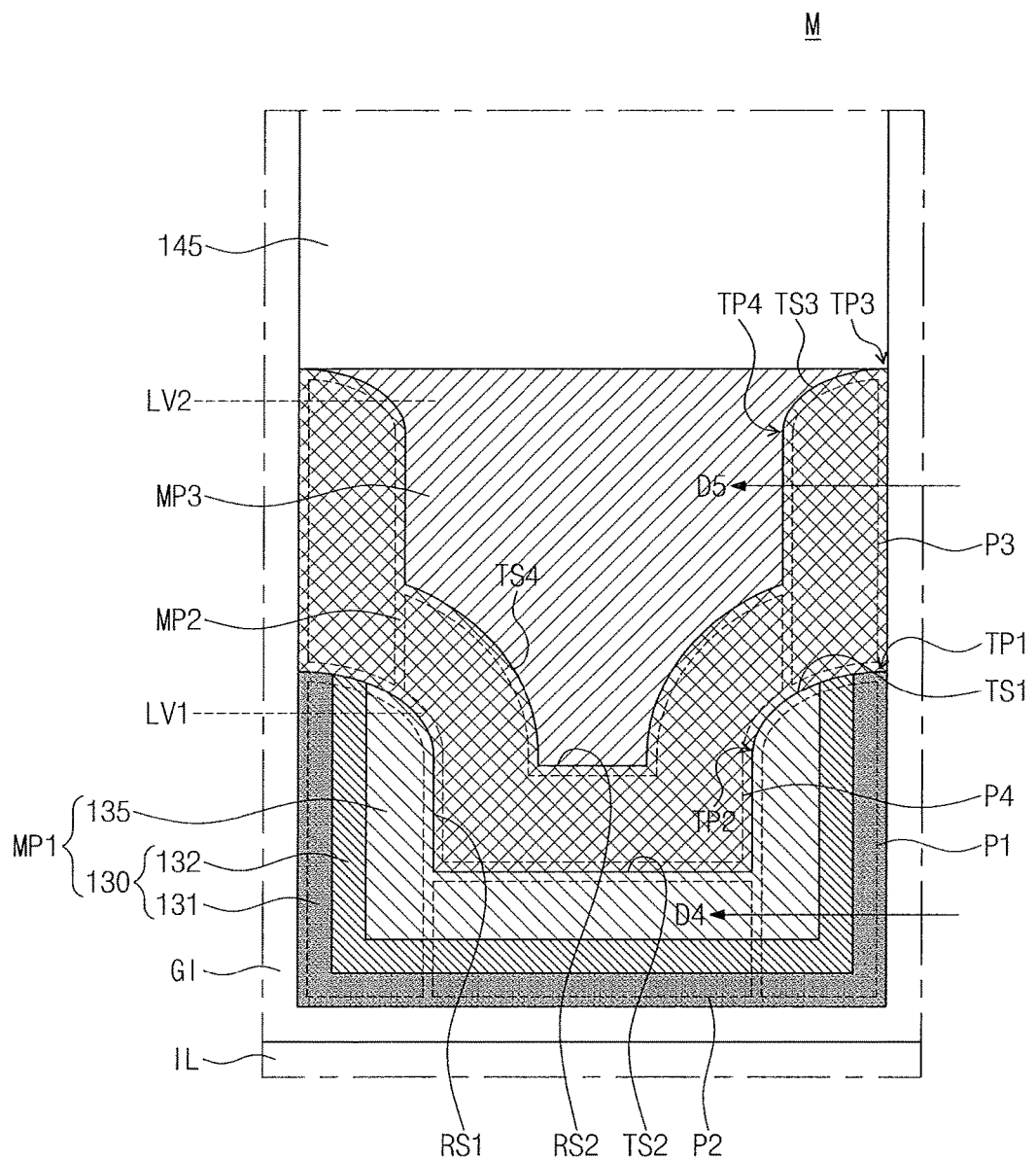
FIG. 3A to FIG. 3E are enlarged cross-sectional views of a region 'M' of scorpion FIG. 2 to illustrate gate electrodes according to embodiments of the inventive concepts.

FIG. 3A to FIG. 3E are enlarged cross-sectional views of a region 'M' of FIG. 2 to illustrate gate electrodes according to embodiments of the inventive concepts. Referring to FIG. 1, FIG. 2, and FIG. 3A, a gate electrode GE may include first, second, and third metal patterns MP1, MP2, and MP3, which are sequentially stacked. The first to third metal patterns MP1, MP2, and MP3 may extend in the first direction D parallel to the gate electrode GE described above.

The first metal pattern MP1 may include a pair of first portions P1 extending in the D3 direction and corresponding to either edge portion thereof, and a second portion P2 extending in the D2 direction and corresponding to a central portion connecting the pair of P1 portions. The second portion P2 may be disposed between the pair of first portions P1. The first portions P1 may be adjacent to the gate spacers 125 disposed on either sidewall of the gate electrode GE. The second portion P2 may directly cover a bottom portion of the gate dielectric pattern GI, which is disposed between the gate electrode GE and the active pattern AP.

The first portions P1 may extend along inner sidewalls of the gate dielectric pattern GI in the third direction D3. Each of the first portions P1 may have a width in the second direction D2 and a height in the third direction D3, and the height may be greater than the width.

Each of the first portions P1 may have a curved top surface TS1. The top surface TS1 may be a surface of an upper portion of the first portion P1, a curvature of which is greater than zero (e.g., the height of the first portion P1 varies across its width as shown in FIG. 3A). The top surface TS1 may have a descent in a fourth direction D4. In other words, a level of the top surface TS1 may become progressively lower in the fourth direction D4. The fourth direction D4 may be a vector from the gate spacer 125 (or the gate dielectric pattern GI) adjacent to the first portion P1 toward the center of the second portion P2, in parallel with the second direction D2.

Specifically, the top surface TS1 of the first portion P1 may have a first point TP1 adjacent to the gate spacer 125 (or the gate dielectric pattern GI) and a second point TP2 adjacent to the second portion P2. In other words, the first point TP1 and the second point TP2 may be spaced apart from each other in the fourth direction D4. Here, the first point TP1 may be disposed at a higher level than the second point TP2.

An average level of the top surface TS1 of the first portion P1 may be disposed at, (or defined as), a first level LV1. The average level of the top surface TS1 may be located at the midpoint between a level of the first point TP1 and a level of the second point TP2. The first level LV1 may be higher than a top surface TS2 of the second portion P2. In other words, the first metal pattern MP1 may have a U-shape, when viewed as the cross-section in FIG. 3A. The first portions P1 and the second portion P2 may define a first recess region RS1 in the first metal pattern MP1.

The first metal pattern MP1 may include a first sub-pattern 130 and a second sub-pattern 135 which are sequentially stacked. A top end surface of the first sub-pattern 130 and a top end surface of the second sub-pattern 135 may be aligned with each other and may be included in the top surface TS1 of the first portion P1. The first sub-pattern 130 may include a first capping pattern 131 and a second capping pattern 132 which are sequentially stacked.

The first capping pattern 131 may directly cover the gate dielectric pattern GI. The second capping pattern 132 may be disposed between the first capping pattern 131 and the second sub-pattern 135. The first and second capping patterns 131 and 132 may adjust a work function of the gate electrode GE. In addition, the first and second capping patterns 131 and 132 may prevent a metal material from being diffused from the second sub-pattern 135, the second metal pattern MP2, or the third metal pattern MP3 into the gate dielectric pattern GI. Conversely, the first and second capping patterns 131 and 132 may prevent the high-K dielectric material from being diffused from the gate dielectric pattern GI into the second sub-pattern 135, the second metal pattern MP2 or the third metal pattern MP3. In other words, the first and second capping patterns 131 and 132 may act as a diffusion barrier layer. In some embodiments, materials of the first and second capping patterns 131 and 132 may be different from each other, and each of the first and second capping patterns 131 and 132 may include at least one material selected from a group consisting of a Metal Nitride, a Metal Carbide, a Metal Silicide, a Metal-Silicon Nitride, and a Metal-Silicon Carbide including at least one of Titanium (Ti) or Tantalum (Ta).

The second sub-pattern 135 may include a metal material having a high work function. The metal material having the high work function may include an N-type work function metal or a P-type work function metal. The N-type work function metal may be a metal material primarily used in a gate electrode of an NMOS field effect transistor, and the P-type work function metal may be a metal material primarily used in a gate electrode of a PMOS field effect transistor. In various embodiments, a work function of the P-type work function metal is greater than that of the N-type work function metal. In some embodiments, the second sub-pattern 135 may include the P-type work function metal. The P-type work function metal may include at least one of Ti, Ta, W, Pd, Ru, Ir, Pt, Nb, Mo, Hf, or any Nitride or Carbide thereof. For example, the P-type work function metal may include at least one of Mo, Pd, Ru, Pt, TiN, WN, TaN, Ir, TaC, RuN, or MoN. In some embodiments, the second sub-pattern 135 may have a multi-layered structure including at least two different P-type work function metals.

The second sub-pattern 135 may prevent atoms or ions from being diffused between the first sub-pattern 130 and the second metal pattern MP2. In addition, the second sub-pattern 135 may inhibit a work function of the second metal pattern MP2 from being excessively increased by the first sub-pattern 130. In other words, the work function of the first sub-pattern 130 may be higher than that of the second sub-pattern 135, and the work function of the second sub-pattern 135 may be higher than that of the second metal pattern MP2. In various embodiments, the second sub-pattern 135 buffers the work function-adjusting function of the first sub-pattern 130.

The second metal pattern MP2 may directly cover a top surface (i.e., TS1 and TS2) of the first metal pattern MP1. The second metal pattern MP2 may include a pair of third portions P3 disposed on top of a respective pair of first portions, corresponding to both edge portions thereof and a fourth portion P4 corresponding to a central portion thereof. The fourth portion P4 may be disposed between the third portions P3. A lower portion of the fourth portion P4 may fill the first recess region RS1.

The third portions P3 may extend along the inner sidewalls of the gate dielectric pattern GI in the third direction D3. Each of the third portions P3 may have a width in the second direction D2 and a height in the third direction D3. The height of the third portion P3 may be greater than the width of the third portion P3. The third portions P3 may vertically overlap with the first portions P1, respectively. In other words, the third portions P3 may extend from the top surfaces TS1 of the first portions P1 in the third direction D2, respectively.

Each of the third portions P3 may have a curved top surface TS3. The top surface TS3 may be a surface of an upper portion of the third portion P3, a curvature of which is greater than zero (e.g. the height of the third portion P3 varies across its width as shown in FIG. 3A). The top surface TS3 may have a descent in a fifth direction D5. In other words, a level of the top surface TS3 may become progressively lower in the fifth direction D5. The fifth direction D5 may be a vector from the gate spacer 125 (or the gate dielectric pattern GI) adjacent to the third portion P3 toward the center of the fourth portion P4, in parallel with the second direction D2.

The top surface TS3 of the third portion P3 may have a third point TP3 adjacent to the gate spacer 125 (or the gate dielectric pattern GI) and a fourth point TP4 adjacent to the fourth portion P4. In other words, the third point TP3 and the fourth point TP4 may be spaced apart from each other in the fifth direction D5. Here, the third point TP3 may be disposed at a higher level than the fourth point TP4.

An average level of the top surface TS3 of the third portion P3 may be disposed at (or defined as) a second level LV2. The average level of the top surface TS3 may be located at a midpoint between a level of the third point TP3 and a level of the fourth point TP4. The second level LV2 may be higher than a top surface TS4 of the fourth portion P4. In addition, the second metal pattern MP2 may have a Y-shape cross-section as shown in FIG. 3A. The third portions P3 and the fourth portion P4 may define a second recess region RS2 in the second metal pattern MP2.

The second metal pattern MP2 may include a metal material having a high work function, (e.g., an N-type work function metal). The N-type work function metal may include an Aluminum (Al) compound containing titanium (Ti) or tantalum (Ta). For example, the N-type work function metal may include TiAlC, TiAlN, TiAlC—N, TiAl, TaAlC, TaAlN, TaAlC—N, or TaAl. In some embodiments, the second metal pattern MP2 may have a multi-layered structure including at least two different N-type work function metals.

The third metal pattern MP3 may directly cover a top surface (i.e., TS3 and TS4) of the second metal pattern MP2. The third metal pattern MP3 may fill the second recess region RS2. The third metal pattern MP3 may include an upper portion adjacent to the third portion P3 and a lower portion adjacent to the fourth portion P4. The lower portion of the third metal pattern MP3 may extend downward from the upper portion of the third metal pattern MP3 toward the substrate 100. In other words, a width in the second direction D2 of the lower portion of the third metal pattern MP3 may decrease as a vertical (D3) distance from the substrate 100 decreases. The protection pattern 145 may directly cover a top surface of the third metal pattern MP3.

In some embodiments, the third metal pattern MP3 may include a low-resistance metal including at least one of Aluminum (Al), Tungsten (W), Titanium (Ti), or Tantalum (Ta). Specific resistance values of the first and second metal patterns MP1 and MP2 may be higher than that of the third metal pattern MP3. Consequently, the AC performance of a transistor may be deteriorated by an increase in resistance of a gate electrode. However, according to some embodiments of the inventive concepts, the resistance of the gate electrode GE may be reduced by the third metal pattern MP3 having the relatively low resistance (compared to the resistance of MP1 and MP2), and thus the AC performance of the field effect transistor may be improved.

A gate electrode GE according to some embodiments of the inventive concepts will be described in detail with reference to FIG. 1, FIG. 2, and FIG. 3B. In the following embodiments, the descriptions of the same components and technical features as in the embodiment of FIG. 1, FIG. 2, and FIG. 3A will be omitted or mentioned briefly for brevity and clarity of explanation. Instead, differences between the following embodiments and the embodiment of FIG. 1, FIG. 2, and FIG. 3A will be mainly described hereinafter.

Figure 3B:
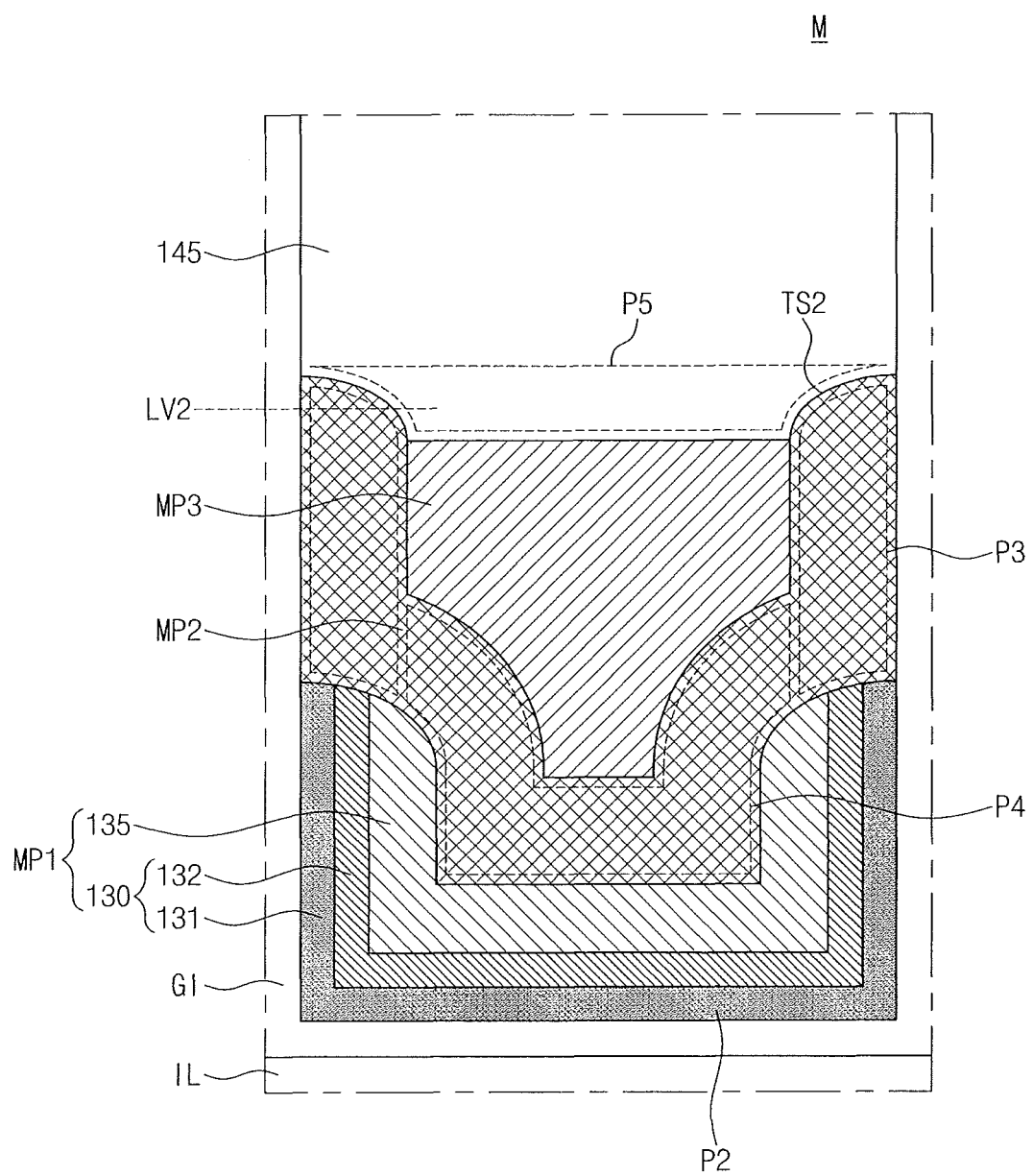

Referring to FIG. 1, FIG. 2, and FIG. 3B, a level of a top surface of the third metal pattern MP3 may be lower than the second level LV2 of the second metal pattern MP2. In other words, the third portions P3 of the second metal pattern MP2 may protrude with respect to the top surface of the third metal pattern MP3. A lower portion P5 of the protection pattern 145 may protrude downward toward the substrate 100. In other words, a width in the second direction D2 of the lower portion P5 of the protection pattern 145 may decrease as a vertical distance from the substrate 100 decreases.

Figure 3C:
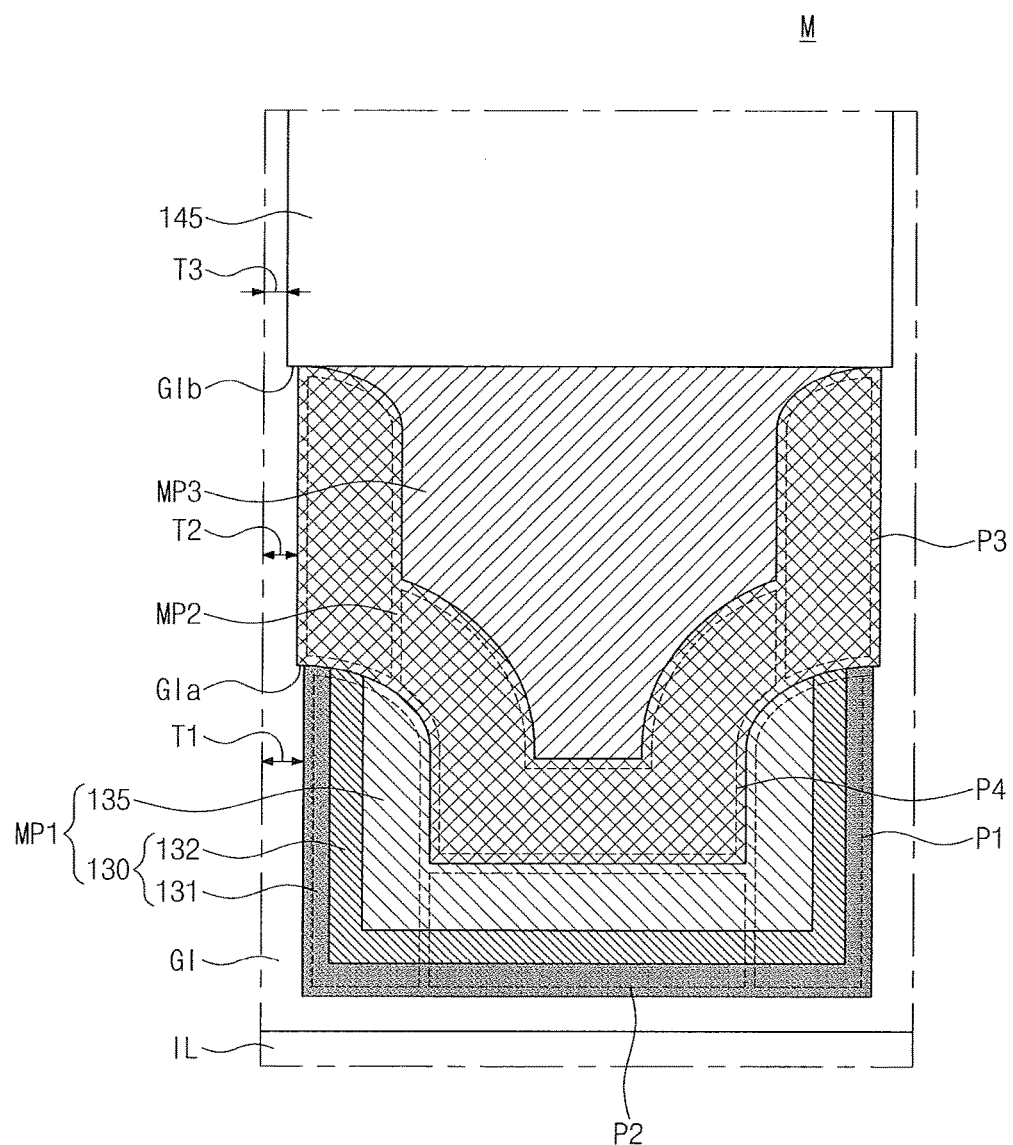

A gate electrode GE according to some embodiments of the inventive concepts will be described in detail with reference to FIG. 1, FIG. 2, and FIG. 3C. In the following embodiments, the descriptions of the same components and technical features as in the embodiment of FIG. 1, FIG. 2, and FIG. 3A will be omitted or mentioned briefly for brevity and clarity of explanation. Instead, differences between the following embodiments and the embodiment of FIG. 1, FIG. 2, and FIG. 3A will be mainly described hereinafter.

A gate dielectric pattern GI may include a first depressed region GIa, (or a first stepped region GIa), formed between the first portion P1 of the first metal pattern MP1 and the third portion P3 of the second metal pattern MP2. Similarly, a second depressed region GIb, (or a second stepped region GIb), may be formed between the third portion P3 and the protection pattern 145. Accordingly, the protection pattern 145 overhangs the third portion P3, which overhangs the first portion P1.

The gate dielectric pattern GI adjacent to the first portion P1 under the first depressed region GIa, (or the first stepped region GIa), may have a first thickness T1. The gate dielectric pattern GI adjacent to the third portion P3 on the first depressed region GIa, (or the first stepped region GIa), may have a second thickness T2. Here, the first thickness T1 may be greater than the second thickness T2. The gate dielectric pattern GI adjacent to the protection pattern 145 on the second depressed region GIb, (or the second stepped region GIb), may have a third thickness T3. Here, the second thickness T2 may be greater than the third thickness T3. In other words, the thickness of the gate dielectric pattern GI may decrease stepwise as a vertical distance from the substrate 100 increases. Thus, a width between outer sidewalls of the first portions P1 of the first metal pattern MP1 may be smaller than a width between outer sidewalls of the third portions P3 of the second metal pattern MP2, and the width between the outer sidewalls of the third portions P3 of the second metal pattern MP2 may be smaller than a width of the protection pattern 145.

Figure 3D:
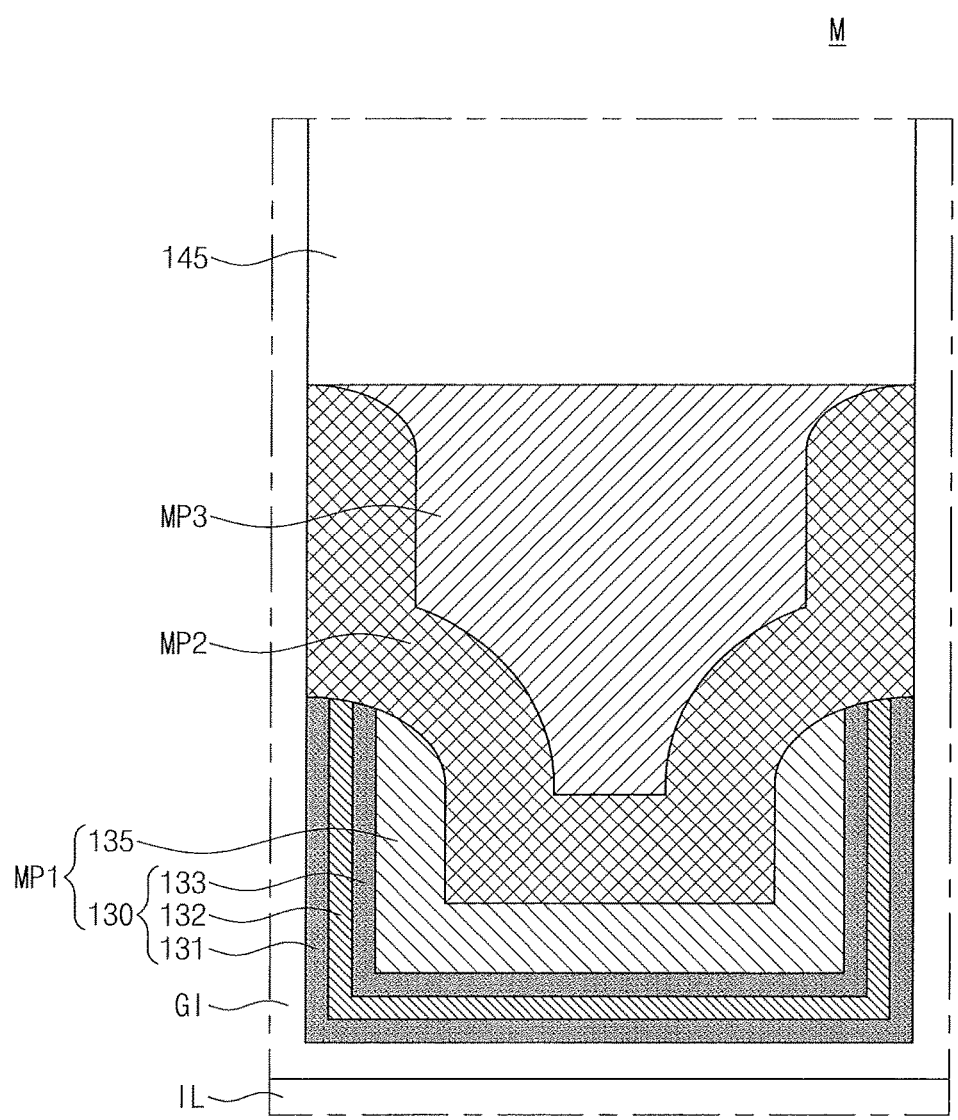

A gate electrode GE according to some embodiments of the inventive concepts will be described in detail with reference to FIG. 1, FIG. 2, and FIG. 3D. In the following embodiments, the descriptions of the same components and technical features as in the embodiment of FIG. 1, FIG. 2, and FIG. 3A will be omitted or mentioned briefly for brevity and clarity of explanation. In other words, differences between the following embodiments and the embodiment of FIG. 1, FIG. 2, and FIG. 3A will be mainly described hereinafter.

A first sub-pattern 130 may include first, second, and third capping patterns 131, 132, and 133, which are sequentially stacked. In some embodiments, the materials of the first to third capping patterns 131, 132, and 133 may be selected independently from each other, and may include at least one selected from a group consisting of a Metal Nitride, a Metal Carbide, a Metal Silicide, a Metal-Silicon Nitride, and a Metal-Silicon Carbide including at least one of Titanium (Ti) or Tantalum (Ta). In some embodiments, the first capping pattern 131 may include Titanium Nitride (TiN), the second capping pattern 132 may include Tantalum Nitride (TaN), and the third capping pattern 133 may include Titanium Nitride (TiN).

A gate electrode GE, according to some embodiments of the inventive concepts, will be described in detail with reference to FIG. 1, FIG. 2, and FIG. 3E. In the following embodiments, the descriptions of the same components and technical features as in the embodiment of FIG. 1, FIG. 2, and FIG. 3A will be omitted or mentioned briefly for brevity and clarity of explanation. Instead, differences between the following embodiments and the embodiment of FIG. 1, FIG. 2, and FIG. 3A will be mainly described hereinafter.

Figure 3E:
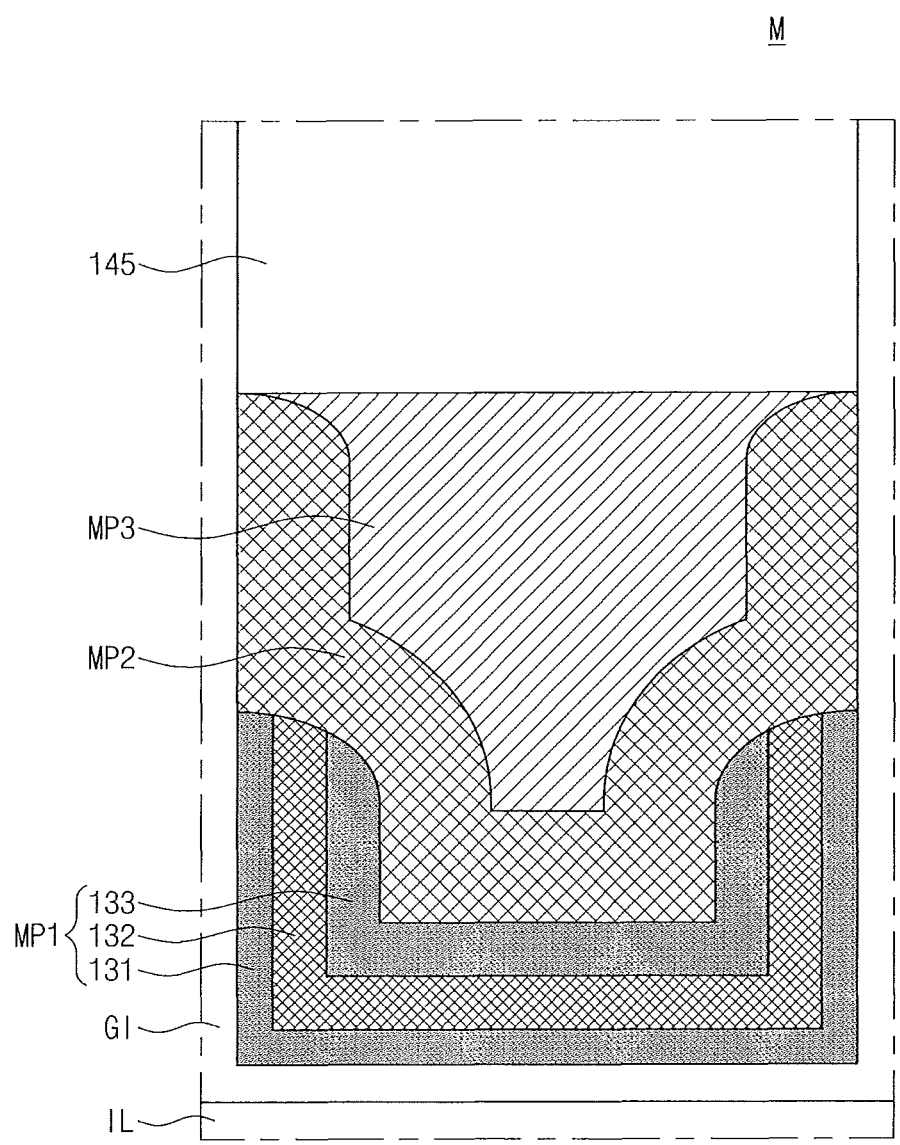

In the embodiment shown in FIG. 3E, the second sub-pattern 135 of the first metal pattern MP1, described above with reference to FIG. 1, FIG. 2, and FIG. 3A is omitted. In other words, the P-type work function metal is omitted. Thus, the gate electrode GE according to the present embodiment may be used as a gate electrode of an NMOS field effect transistor. The first metal pattern MP1 may include first, second, and third capping patterns 131, 132, and 133, which are sequentially stacked. The first to third capping patterns 131, 132, and 133 of FIG. 3E may be the same as described with reference to FIG. 3D.

FIG. 4A to FIG. 9A are perspective views illustrating embodiments of the inventive concepts at sequential steps of manufacturing a semiconductor device. FIG. 4B to FIG. 9B are cross-sectional views of FIG. 4A to FIG. 9A respectively, taken along lines I-I' and II-II'.

Figure 4A:
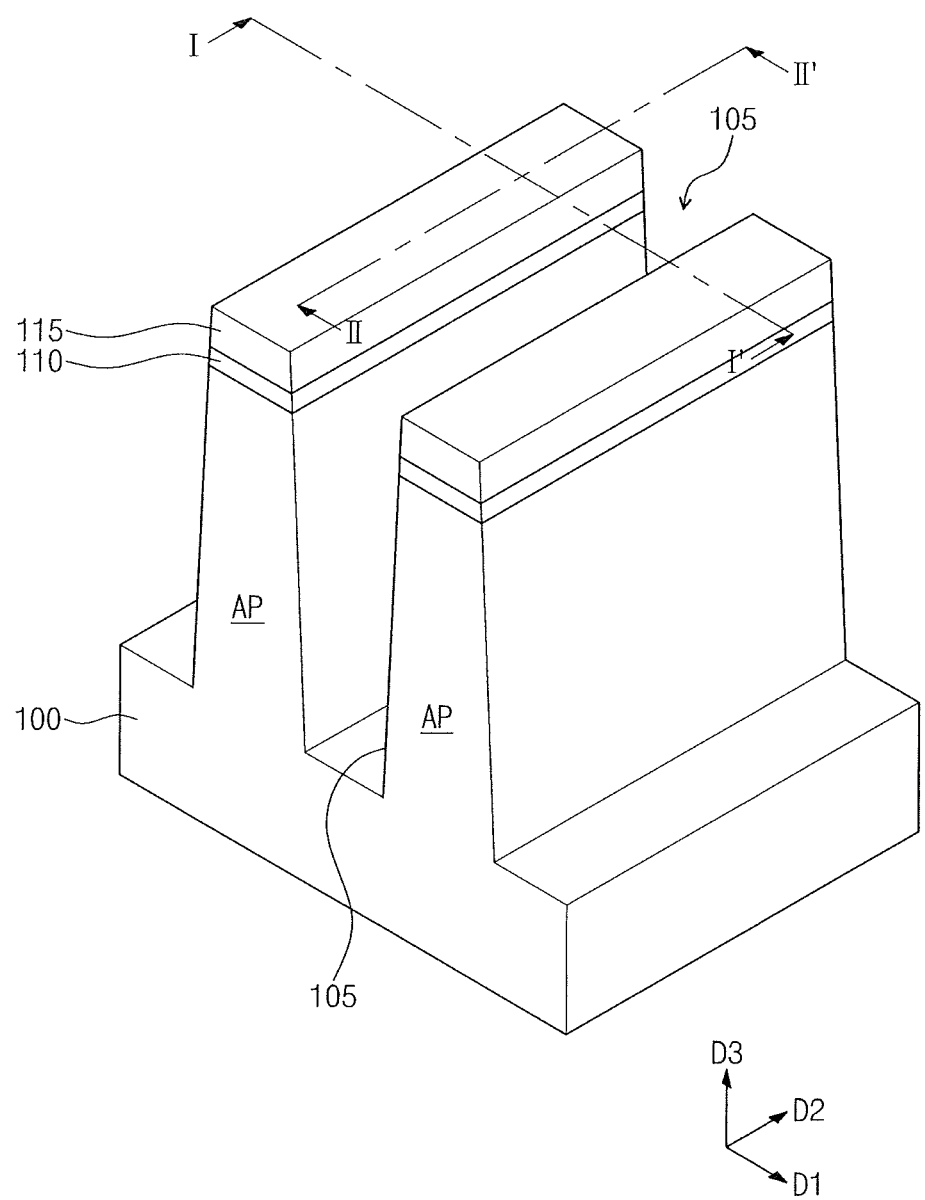
Figure 4B:
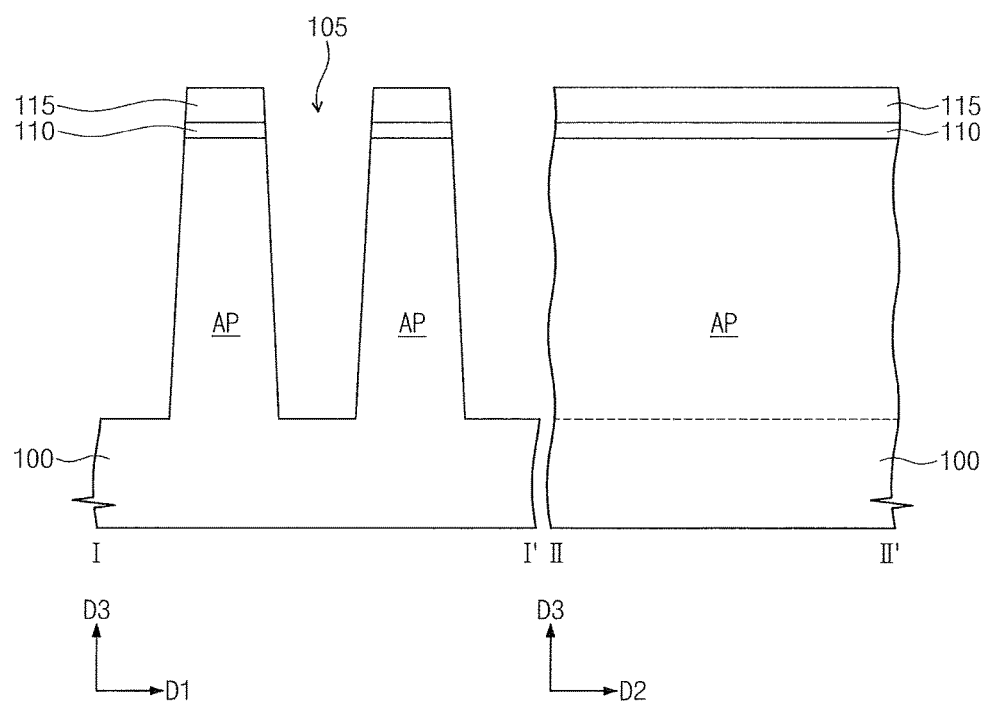

Referring to FIG. 4A and FIG. 4B, a substrate 100 may be patterned to form device isolation trenches 105 defining active patterns AP. The substrate 100 may be a semiconductor substrate including Silicon, Germanium, Silicon-Germanium, or may be a compound semiconductor substrate. The active patterns AP may be doped with dopants of a first conductivity type.

Forming the device isolation trenches 105 may include forming mask patterns on the substrate 100, and anisotropically etching the substrate 100 using the mask patterns as etch masks. In some embodiments, each of the mask patterns may include a first mask pattern 110 and a second mask pattern 115 which are sequentially stacked. The first mask pattern 110 may have an etch selectivity with respect to the second mask pattern 115. Each of the device isolation trenches 105 may have an aspect ratio of 5 or more. In some embodiments, each of the device isolation trenches 105 may become progressively narrower toward a bottom surface of each of the device isolation trenches 105. Thus, a width of each of the active patterns AP may become progressively narrower toward a top surface of each of the active patterns A.

Figure 5A:
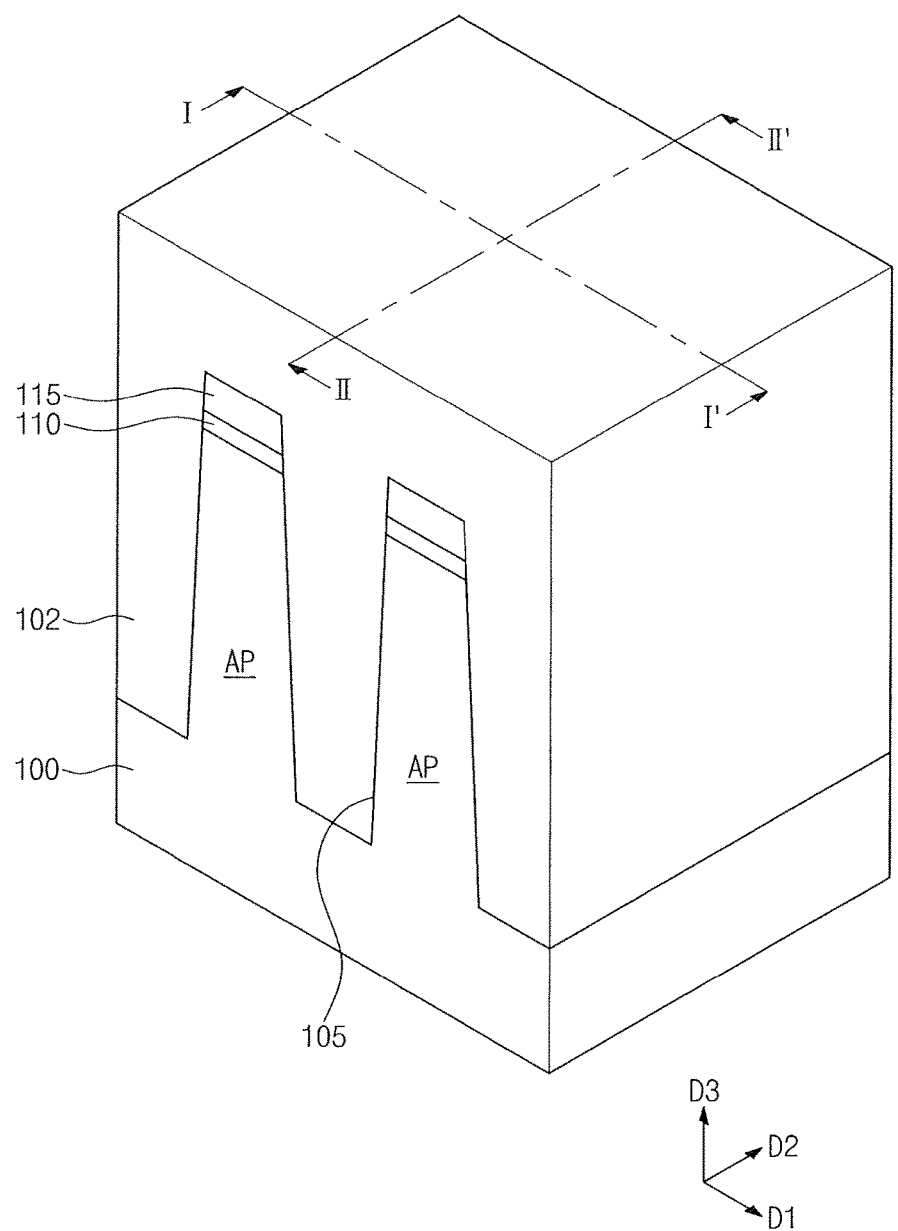
Figure 5B:
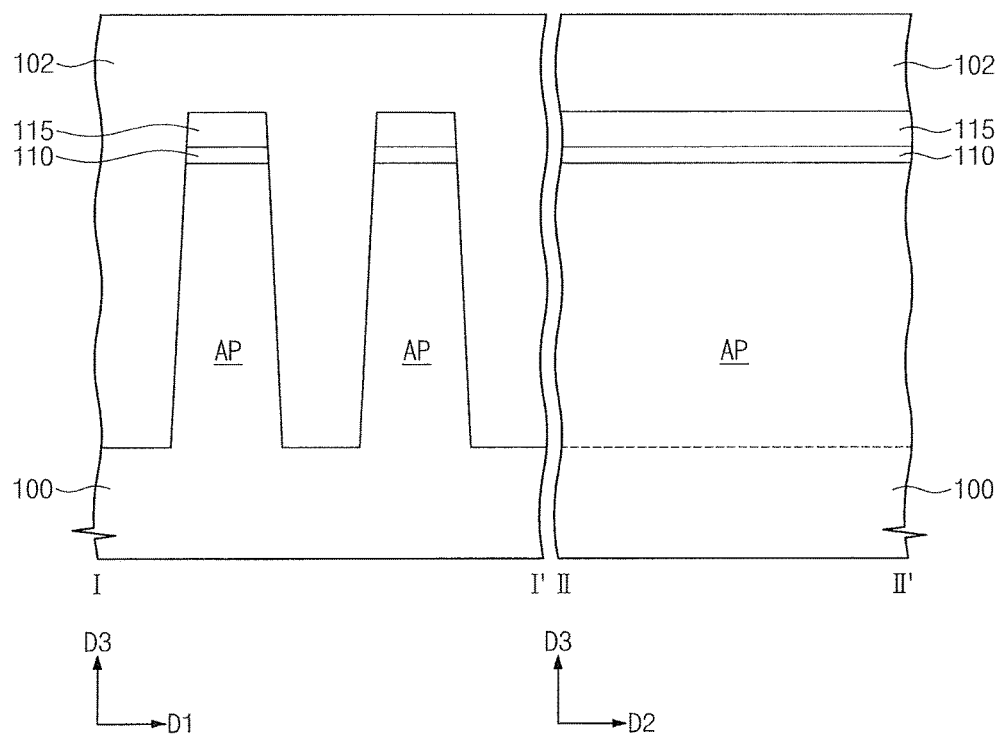

Referring to FIG. 5A and FIG. 5B, an insulating layer 102 may be formed on an entire top surface of the substrate 100 to fill the device isolation trenches 105. The insulating layer 102 may be formed to cover the first and second mask patterns 110 and 115. For example, the insulating layer 102 may include a Silicon Oxide layer.

Figure 6A:
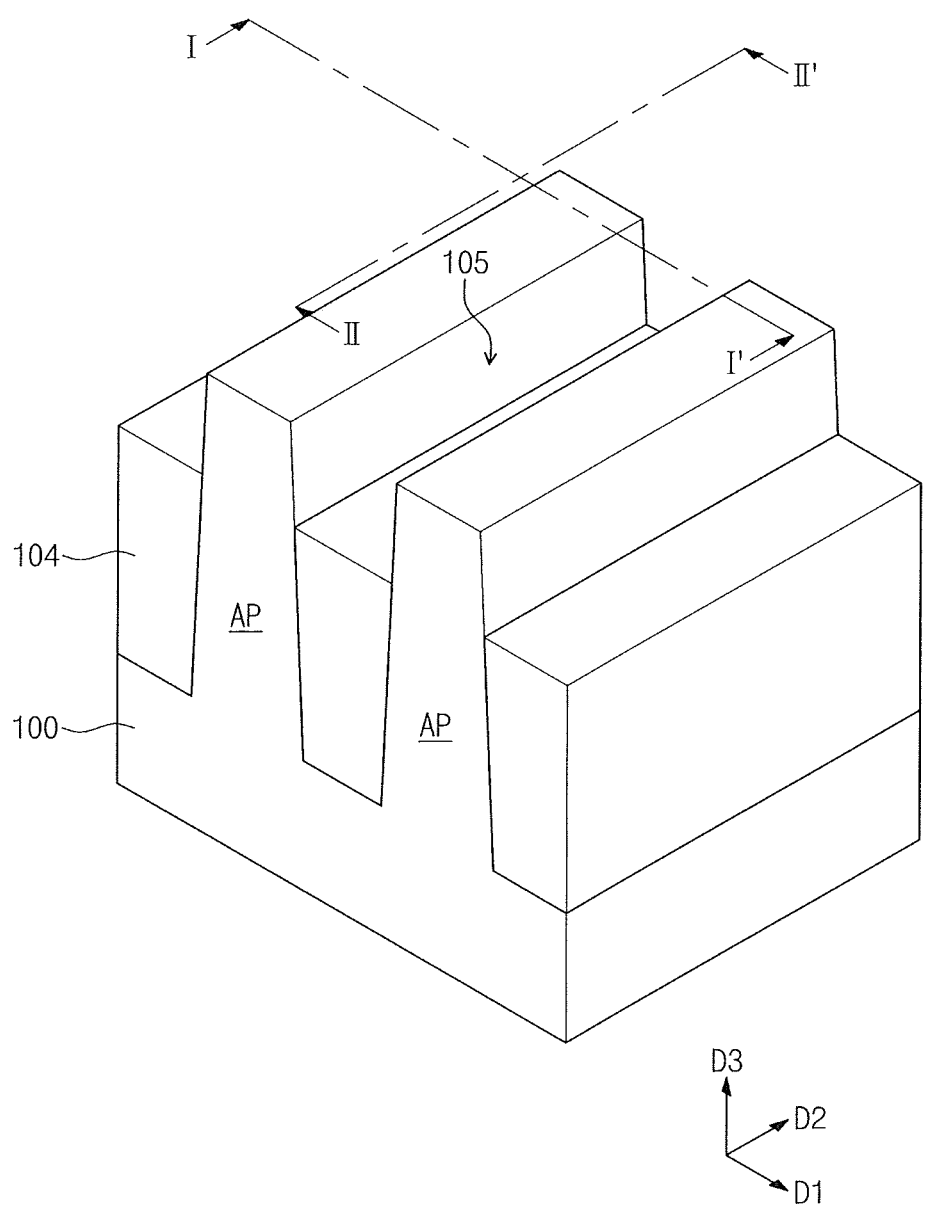
Figure 6B:
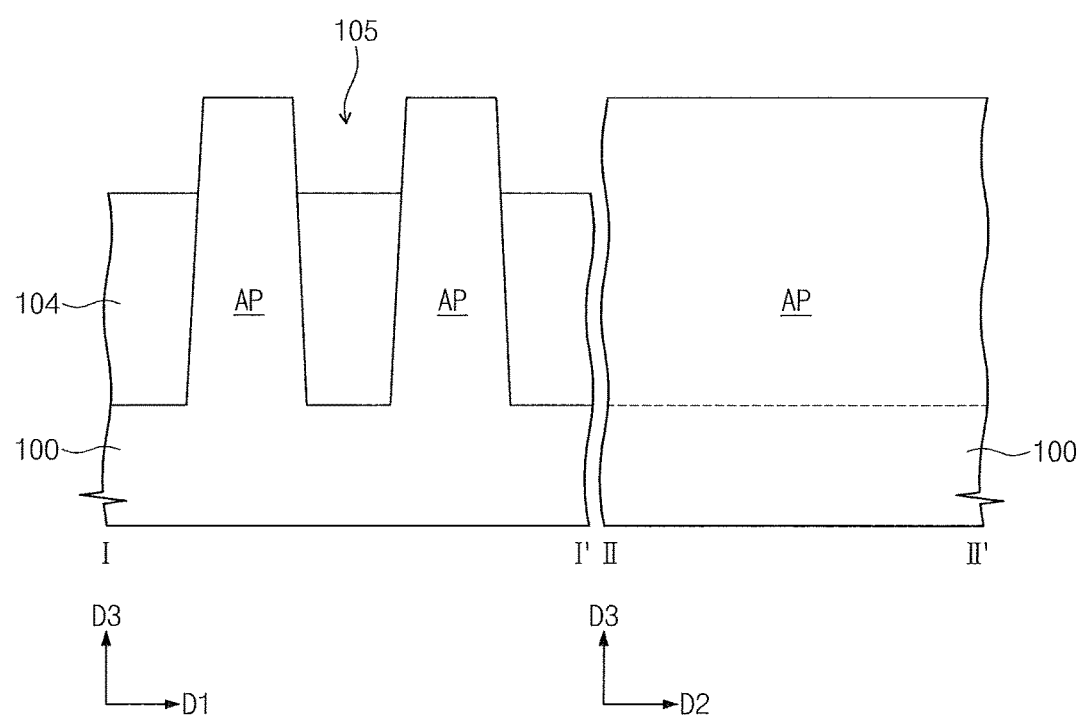

Referring to FIG. 6A and FIG. 6B, an upper portion of the insulating layer 102 may be recessed to form device isolation layers 104 in the device isolation trenches 105. For example, the insulating layer 102 may be planarized until top surfaces of the first or second mask patterns 110 or 115 are exposed. Thus, the insulating layer 102 may remain locally in the device isolation trenches 105. Subsequently an upper portion of the planarized insulating layer 102 may be wet-etched. The planarized insulating layer 102 may be etched using an etch recipe having an etch selectivity with respect to the active patterns AP. For example, the etchant will preferentially etch the insulating layer 102 instead of the active patterns AP. The remaining mask patterns 110 and 115 may be removed while the upper portion of the planarized insulating layer 102 is etched to form the device isolation layers 104. The process of etching the upper portion of the planarized insulating layer 102 may be performed until upper portions of the active patterns AP are exposed above the device isolation layers 104. The exposed upper portions of the active patterns AP may have fin shapes.

Figure 7A:
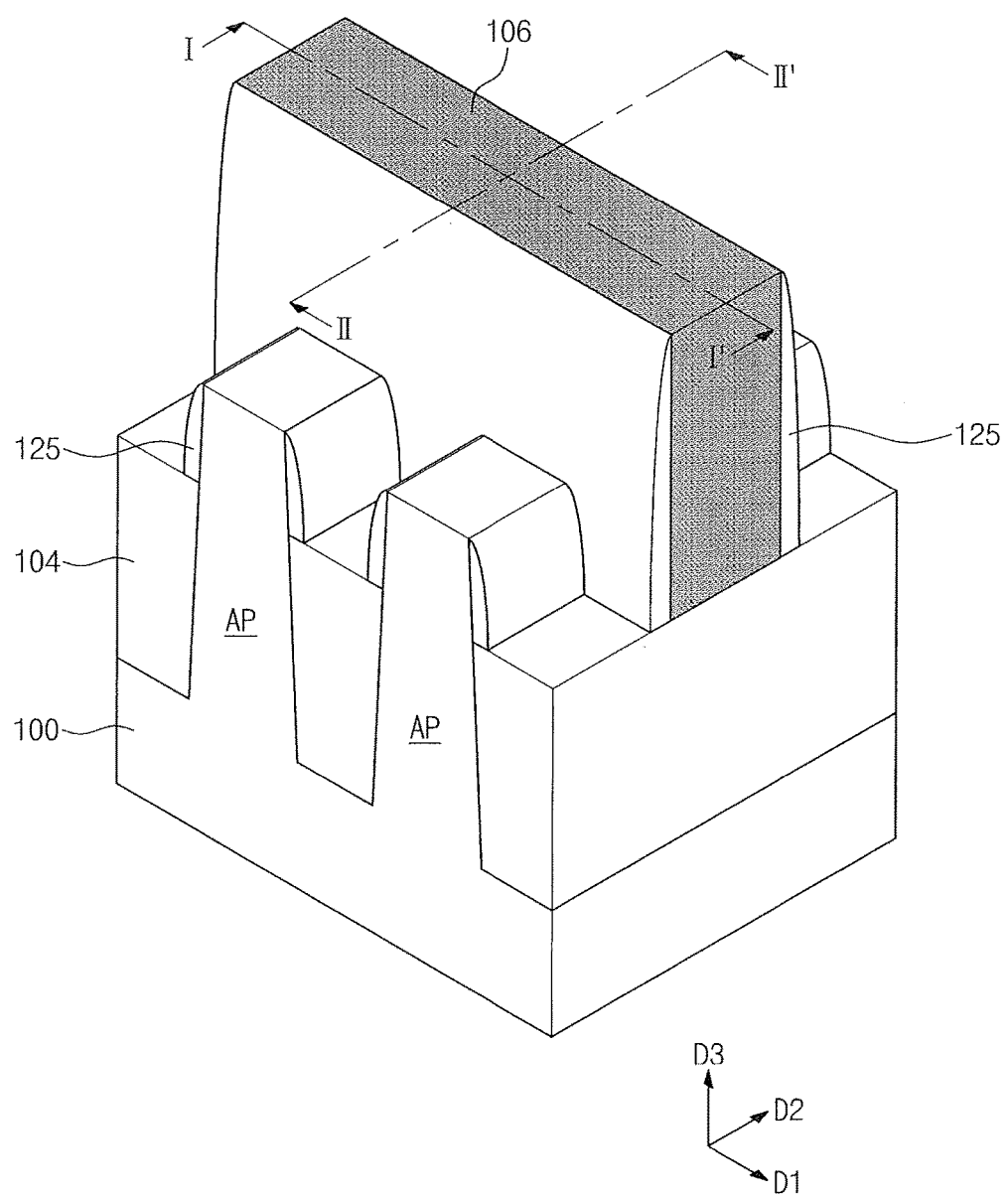
Figure 7B:
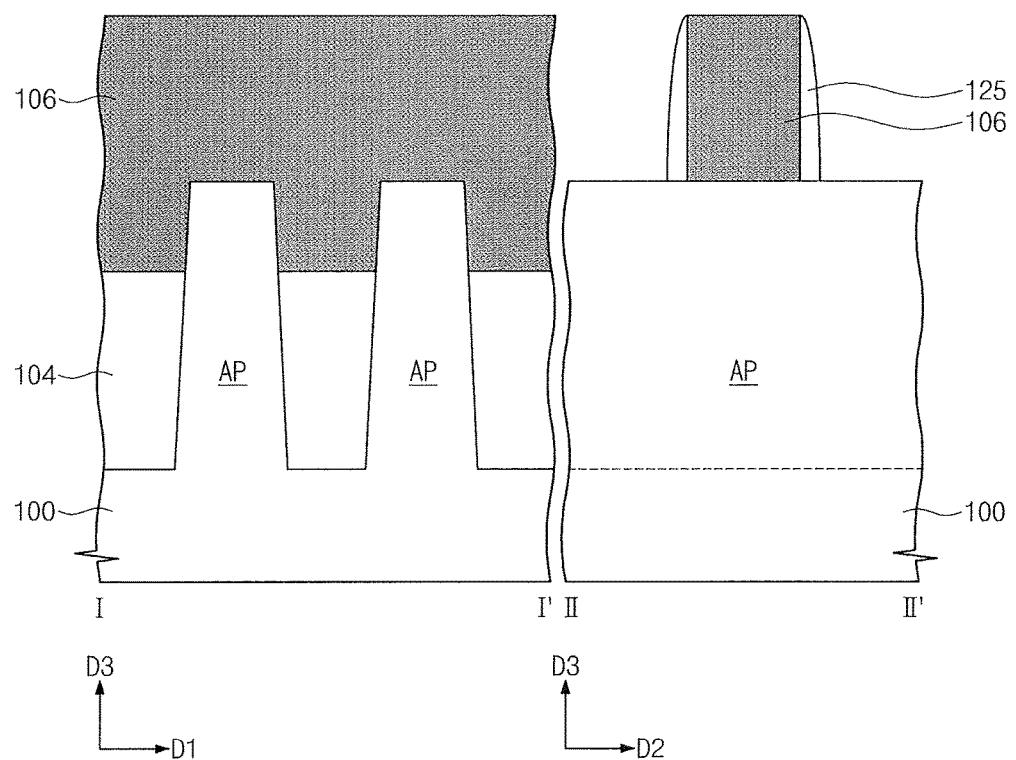

Referring to FIG. 7A and FIG. 7B, a sacrificial gate pattern 106 may be formed on the active patterns AP. The sacrificial gate pattern 106 may have a line or bar shape that extends in a first direction D1 to intersect the active patterns AP. In some embodiments, a sacrificial gate layer may be formed on the active patterns AP and the device isolation layers 104, and a gate mask pattern defining the sacrificial gate pattern 106 may be formed on the sacrificial gate layer. The sacrificial gate layer may be patterned using the gate mask pattern as an etch mask, thereby forming the sacrificial gate pattern 106. The sacrificial gate layer may include a Poly-Silicon layer. The gate mask pattern may include Silicon Nitride or Silicon Oxynitride.

Gate spacers 125 may be formed on both sidewalls of the sacrificial gate pattern 106, respectively. In some embodiments, a spacer layer may be conformally formed on an entire top surface of the substrate 100, and an anisotropic etching process may be performed on the spacer layer to form the gate spacers 125. Thus, spacers 125 may also be formed on both sidewalls of the exposed active patterns AP. For example, the spacer layer may be formed of at least one of $SiO_2$, SiCN, SiCON, or SiN. In some embodiments, the spacer layer may be formed of a multi-layer structure including at least two materials selected from a group consisting of $SiO_2$, SiCN, SiCON, and SiN.

Figure 8A:
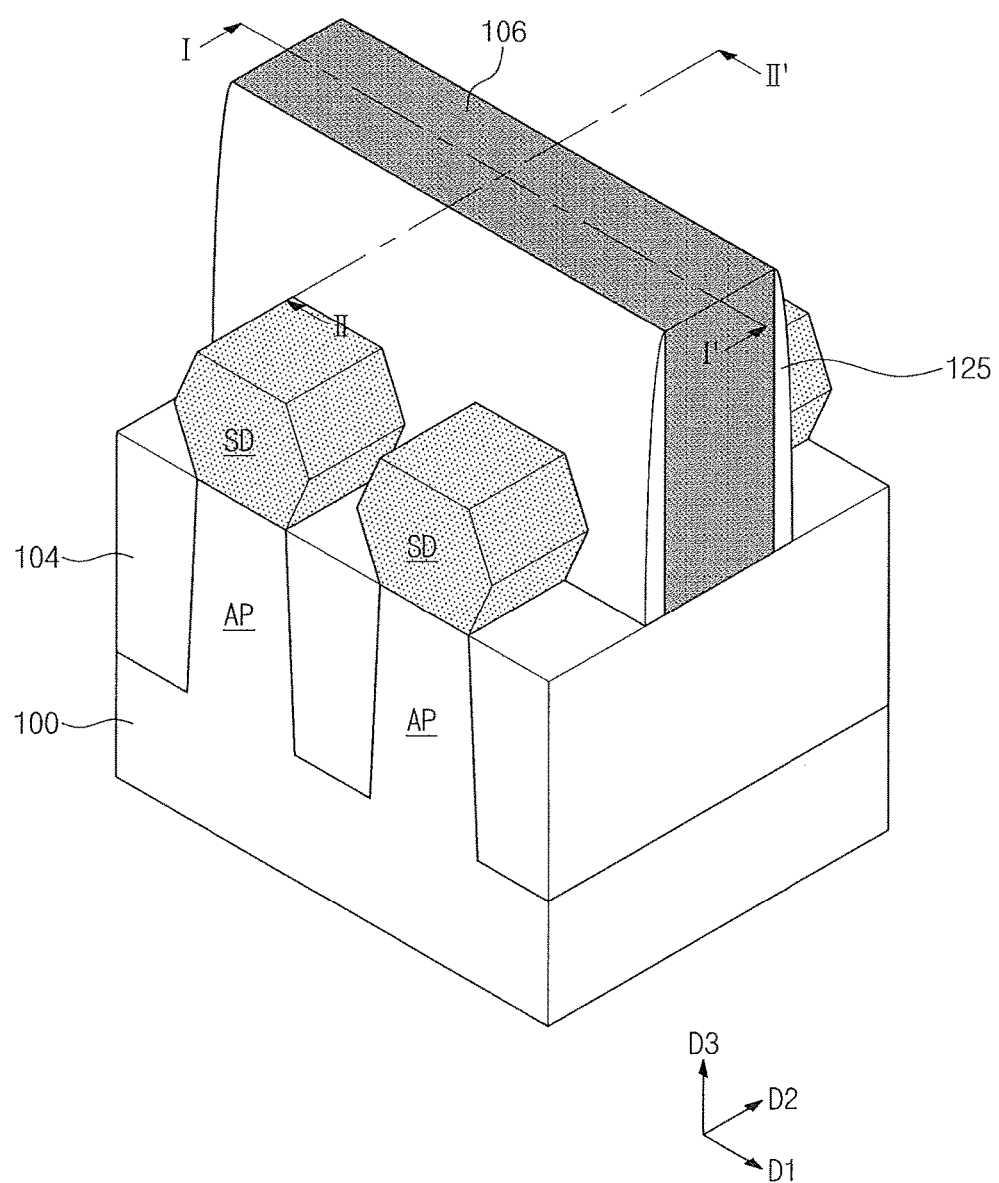
Figure 8B:
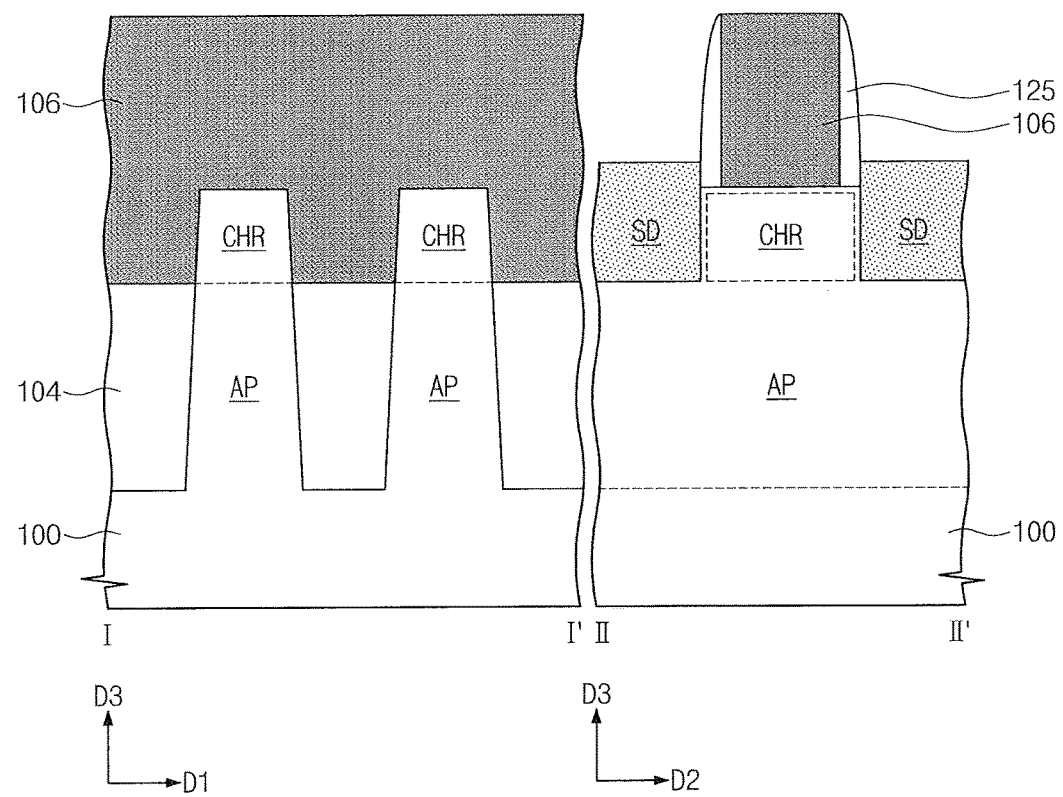

Referring to FIG. 8A and FIG. 8B, the source and drain patterns SD may be formed at both sides of the sacrificial gate pattern 106. In some embodiments, upper portions of the exposed active patterns AP at both sides of the sacrificial gate pattern 106 may be selectively removed. In another embodiment, the spacers 125 disposed on the sidewalls of the active patterns AP may be removed together with the upper portions of the active patterns AP. In some embodiments, an additional mask pattern protecting the sacrificial gate pattern 106 and the gate spacers 125 on the both sidewalls of the sacrificial gate pattern 106 may be used as an etch mask when the upper portions of the active patterns AP are removed.

After the removal of the upper portions of the active patterns AP, the source and drain patterns SD may be formed using etched top surfaces of the active patterns AP as a seed. The source and drain patterns SD may be formed by a selective epitaxial growth (SEG) process. For example, the SEG process may include a chemical vapor deposition (CVD) process or a molecular beam epitaxy (MBE) process. The source and drain patterns SD may be formed to define a channel region CHR between the source and drain patterns SD in each of the active patterns AP.

In some embodiments, top surfaces of the source and drain patterns SD may be higher than top surfaces of the channel regions CHR. In some embodiments, the top surfaces of the source and drain patterns SD may have a curvature that is greater than zero. For example, the source and drain patterns SD may have top surfaces that are convexed upward.

The source and drain patterns SD may be formed using a different semiconductor element from the substrate 100. In some embodiments, the source and drain patterns SD may be formed using a semiconductor element of which a lattice constant is greater or smaller than that of the semiconductor element of the substrate 100. Because the source and drain patterns SD are formed of the different semiconductor element from the substrate 100, the source and drain patterns SD may provide compressive stress or tensile stress to the channel regions CHR.

The source and drain patterns SD may be doped with dopants of a second conductivity type different from the first conductivity type of the active patterns AP. In some embodiments, the source and drain patterns SD may be doped with the dopants of the second conductivity type in-situ during the formation of the source and drain patterns SD. In certain embodiments, the dopants of the second conductivity type may be introduced into the source and drain patterns SD by an ion implantation process after the formation of the source and drain patterns SD.

Figure 9A:
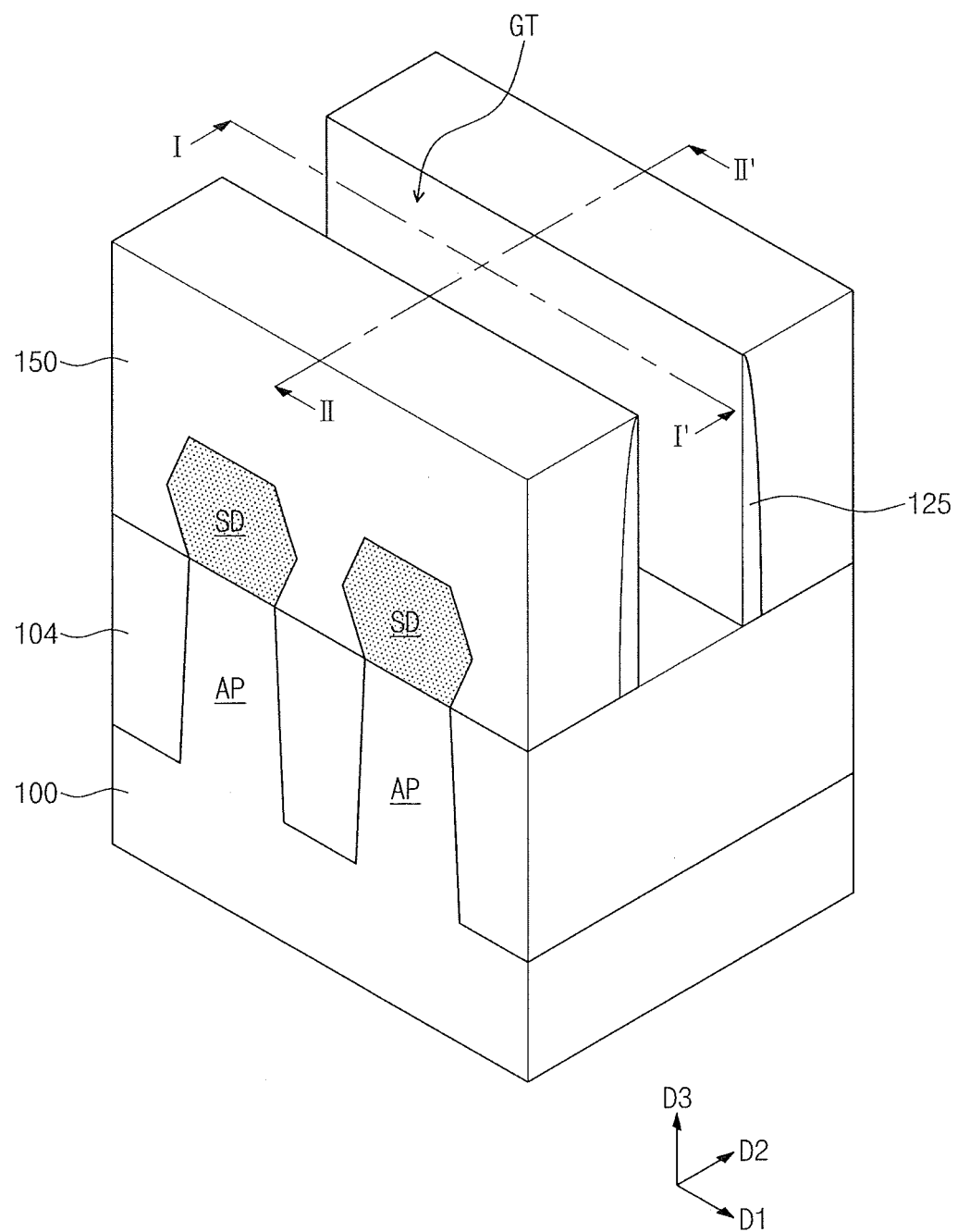
Figure 9B:
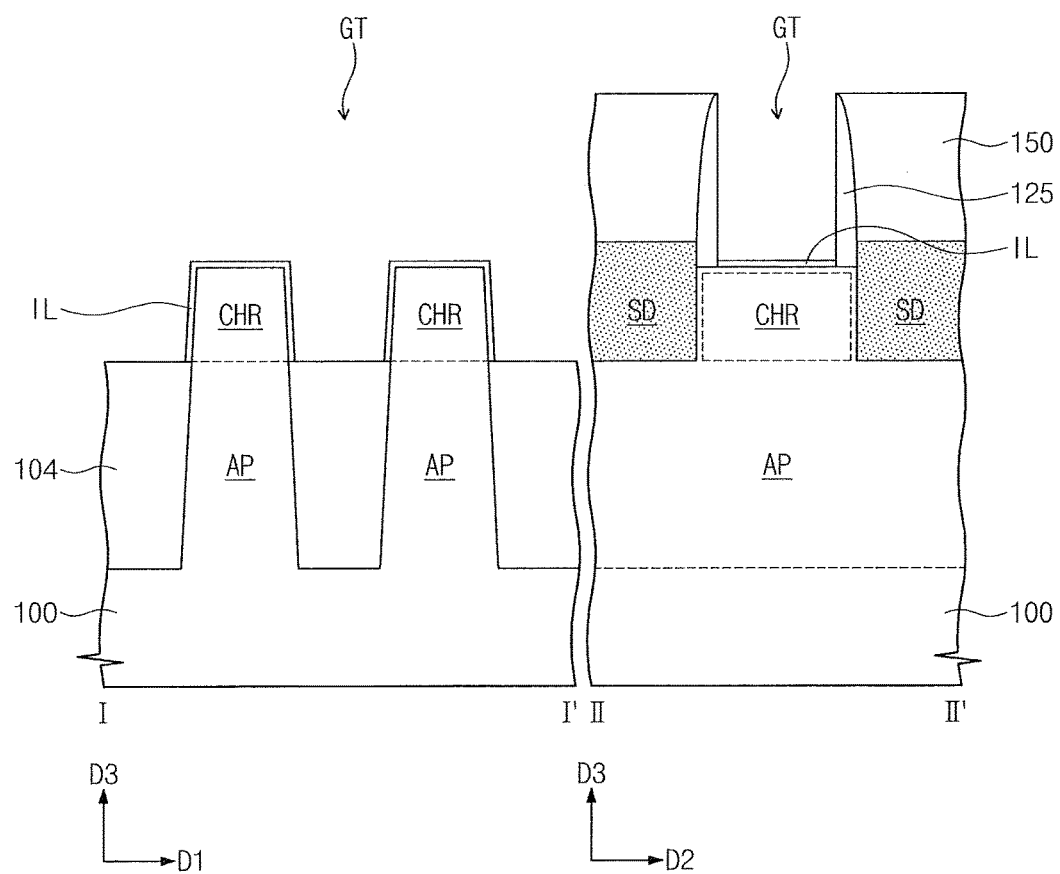

Referring to FIG. 9A and FIG. 9B, an interlayer insulating layer 150 may be formed to cover the source and drain patterns SD. In some embodiments, forming the interlayer insulating layer 150 may include forming an insulating layer covering the sacrificial gate pattern 106, the gate spacers 125, and the source and drain patterns SD on an entire top surface of the substrate 100. For example, the interlayer insulating layer 150 may include a Silicon Oxide layer and may be formed by a flowable chemical vapor deposition (FCVD) process.

Subsequently, the interlayer insulating layer 150 may be planarized until a top surface of the sacrificial gate pattern 106 is exposed. The planarization process of the interlayer insulating layer 150 may be performed using an etch-back process or a chemical mechanical polishing (CMP) process.

The exposed sacrificial gate pattern 106 may be selectively removed to form a gate trench GT. Forming the gate trench GT may include performing an etching process of selectively removing the sacrificial gate pattern 106. The channel regions CHR of the active patterns AP may be exposed through the gate trench GT.

Interface patterns IL may be formed on the channel regions CHR exposed through the gate trench GT. In some embodiments, an oxidation process using plasma may be performed on the channel regions CHR to grow the interface patterns IL from the channel regions CHR. In other words, the interface patterns IL may be a product obtained by thermal oxidation or chemical oxidation of the exposed channel regions CHR or both. The oxidation process may use the plasma of at least one of Oxygen ($O_2$), Ozone ($O_3$), or water vapor ($H_2O$). For example, the interface patterns IL may include at least one of $SiO_2$ or SiON.

Referring again to FIG. 1 and FIG. 2, a gate dielectric pattern GI and a gate electrode GE may be sequentially formed in the gate trench GI. Next, a protection pattern 145 may be formed on a top surface of the gate electrode GE. The protection pattern 145 may completely fill the gate trench GT on the gate electrode GE.

FIG. 10 to FIG. 15 are cross-sectional views corresponding to the line II-II' of FIG. 1 to illustrate embodiments of the inventive concepts at sequential steps of manufacturing a gate electrode. Hereinafter, a method of forming a gate electrode GE in a cross-sectional view taken along the second direction D2 will be described in detail with reference to FIG. 10 to FIG. 15.

Figure 10:
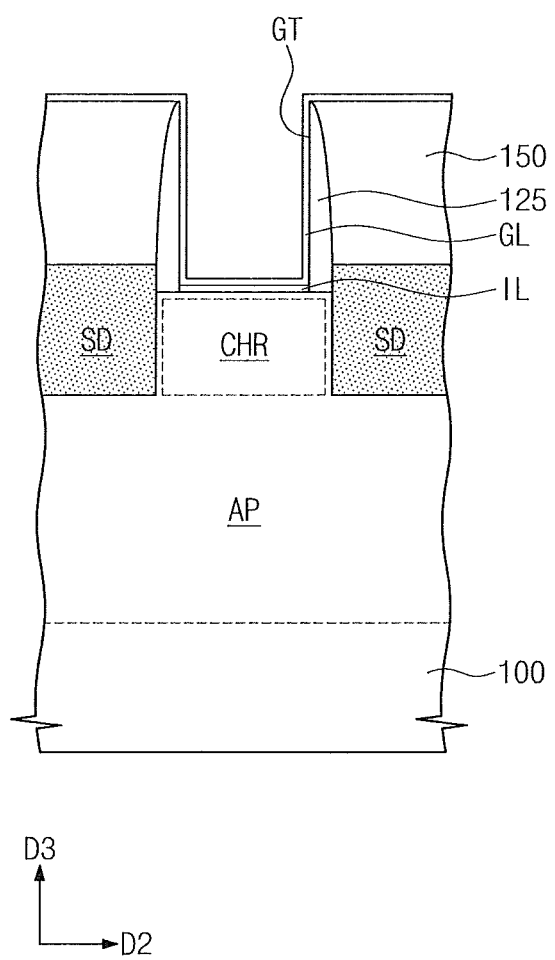
FIG. 10 to FIG. 15 are cross-sectional views corresponding to the line II-II' of FIG. 1 to illustrate embodiments of the inventive concepts at sequential steps of manufacturing a gate electrode.

Referring to FIG. 10, a gate dielectric layer GL may be formed in the gate trench GT shown in FIG. 9A and FIG. 9B, and on the interlayer insulating layer 150 shown in FIG. 9A and FIG. 9B. The gate dielectric layer GL may be conformally formed to partially fill the gate trench GT. The gate dielectric layer GL may directly cover top surfaces of the interface patterns IL and the inner sidewalls of the gate spacers 125.

The gate dielectric layer GL may be formed by an atomic layer deposition (ALD) process, or a chemical oxidation process. In some embodiments, the gate dielectric layer GL may be formed with a high-K dielectric material. For example, the high-K dielectric material may include at least one of Hafnium Oxide, Hafnium-Silicon Oxide, Lanthanum Oxide, Zirconium Oxide, Zirconium-Silicon Oxide, Tantalum Oxide, Titanium Oxide, Barium-Strontium-Titanium Oxide, Barium-Titanium Oxide, Strontium-Titanium Oxide, Lithium Oxide, Aluminum Oxide, Lead-Scandium-Tantalum Oxide, or Lead-Zinc Niobate.

Figure 11:
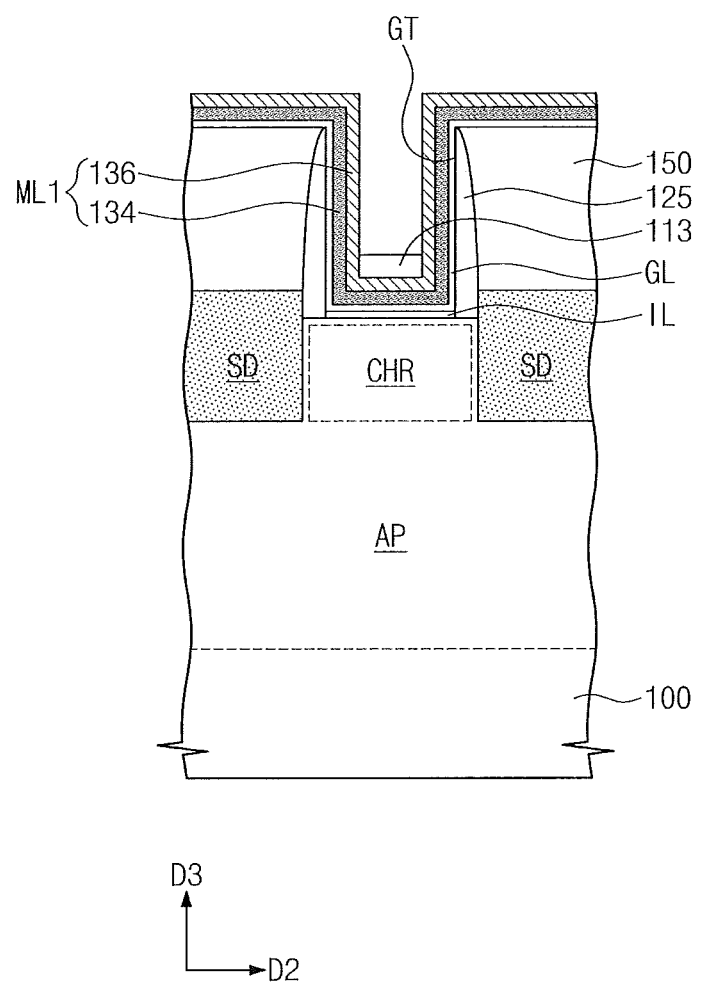

Referring to FIG. 11, a first metal layer ML1 may be formed in the gate trench GT and on the interlayer insulating layer 150. The first metal layer ML1 may be conformally formed to partially fill the gate trench GT. Forming the first metal layer ML1 may include sequentially forming a first sub-metal layer 134 and a second sub-metal layer 136. In some embodiments, the first sub-metal layer 134 may include a first capping layer and a second capping layer, (see FIG. 3A).

Each of the first and second sub-metal layers 134 and 136 may be formed by an ALD process or a CVD process. In some embodiments, the first sub-metal layer 134 may be formed with at least one material selected from a group consisting of a Metal Nitride, a Metal Carbide, a Metal Silicide, a Metal-Silicon Nitride, and a Metal-Silicon Carbide including at least one of Titanium (Ti) or Tantalum (Ta). The second sub-metal layer 136 may be formed using a P-type work function metal. For example, the P-type work function metal may include a metal including at least one of Ti, Ta, W, Pd, Ru, Ir, Pt, Nb, Mo, or Hf or may include a Nitride or Carbide containing the metal.

A first dummy filler layer 113 may be formed to partially fill the gate trench GT after the formation of the first metal layer ML1. In some embodiments, the first dummy filler layer 113 may include an organic compound containing Carbon. The first dummy filler layer 113 may be formed on an entire top surface of the substrate 100 by a spin coating method. An etch-back process may be performed on the first dummy filler layer 113 formed on the entire top surface of the substrate 100 to leave the first dummy filler layer 113 only within the gate trench GT. In certain embodiments, the first dummy filler layer 113 may be formed of a Silicon Oxide layer or a Poly-Silicon layer. When the first dummy filler layer 113 is formed with the Silicon Oxide layer or the Poly-Silicon layer, the first dummy filler layer 113 may be formed using a CVD process.

Figure 12:
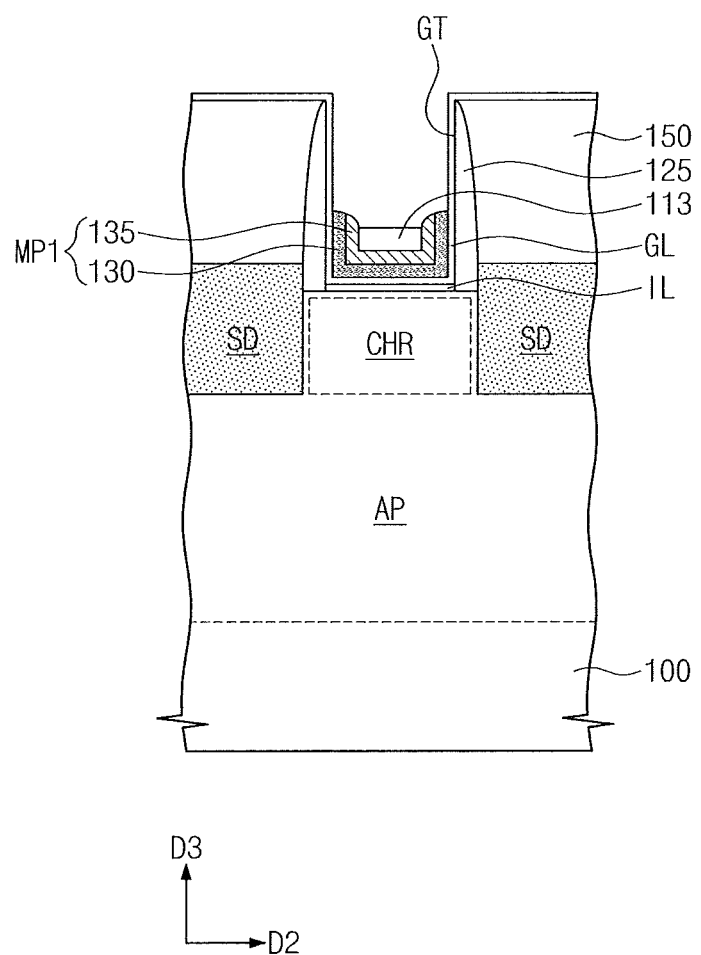

Referring to FIG. 12, an upper portion of the first metal layer ML1 may be removed to form a first metal pattern MP1. In some embodiments, the upper portion of the first metal layer ML1 in the gate trench GT may be removed by an etching process, thereby leaving a lower portion of the first metal layer ML1 in the gate trench GT. The first dummy filler layer 113 may be used as an etch mask to protect the lower portion of the first metal layer ML1 adjacent thereto.

The lower portion of the first metal layer ML1 remaining in the gate trench GT may be defined as the first metal pattern MP1.

The upper portion of the first metal layer ML1 in the gate trench GT may be selectively removed using a dry etching process or a wet etching process. An exposed top surface of the first metal pattern MP1 may be curved by the etching process. A level of a top surface of the first dummy filler layer 113 may be substantially the same as a level of a second point TP2 of the exposed top surface TS1 of the first metal pattern MP1, (see FIG. 3A).

In some embodiments, a portion of the gate dielectric layer GL exposed above the first metal pattern MP1 may also be etched during the etching process for forming the first metal pattern MP1. Thus, a first depressed region GIa (or a first stepped region GIa) may be formed at the gate dielectric layer GL, (see FIG. 3C).

Figure 13:
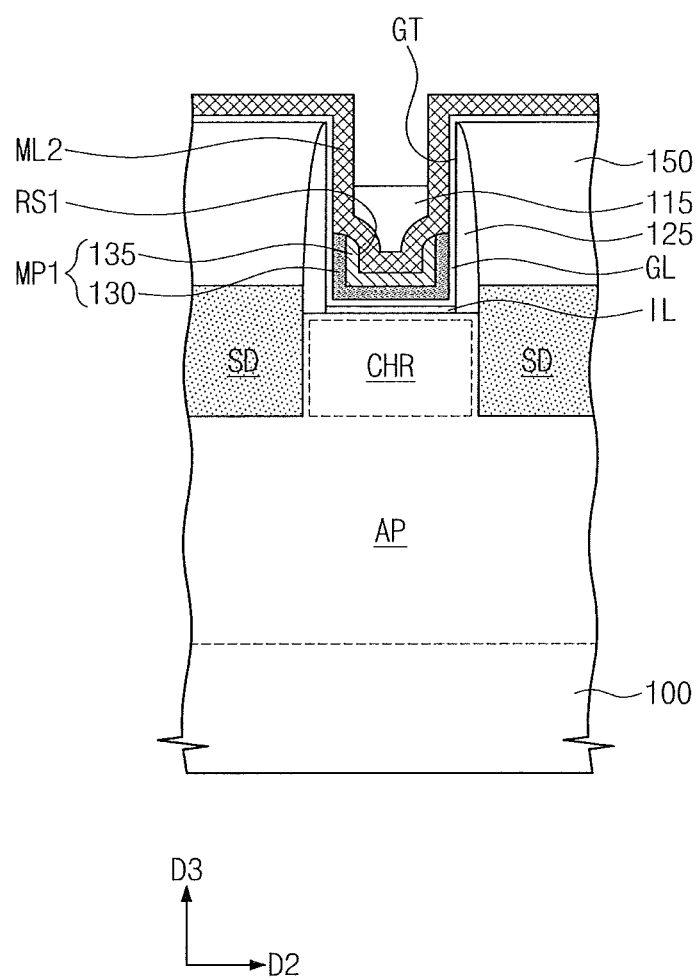

Referring to FIG. 13, a second metal layer ML2 may be formed on the first metal pattern MP1 disposed in the gate trench GT and the interlayer insulating layer 150. The second metal layer ML2 may be conformally formed to partially fill the gate trench GT. The first dummy filler layer 113 may be selectively removed to expose a first recess region RS1 defined by the first metal pattern MP1 before the formation of the second metal layer ML2. The second metal layer ML2 may fill the first recess region RS1 exposed by the removal of the first dummy filler layer 113.

The second metal layer ML2 may be formed by an ALD process or a CVD process. The second metal layer ML2 may be formed using an N-type work function metal. In some embodiments, the N-type work function metal may include an Aluminum compound containing Titanium (Ti) or Tantalum (Ta). For example, the N-type work function metal may include TiAlC, TiAlN, TiAlC—N, TiAl, TaAlC, TaAlN, TaAlC—N, or TaAl.

A second dummy filler layer 115 may be formed to partially fill the gate trench GT after the formation of the second metal layer ML2. The second dummy filler layer 115 may be formed by the same formation method of the first dummy filler layer 113, (see FIG. 11).

Figure 14:
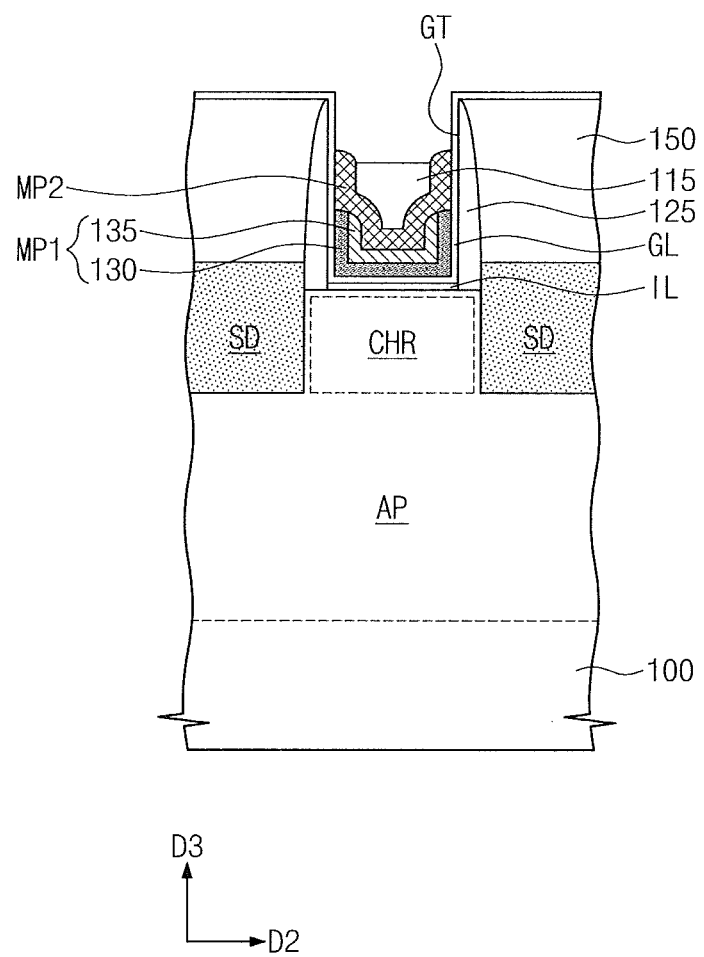

Referring to FIG. 14, an upper portion of the second metal layer ML2 may be removed to form a second metal pattern MP2. In some embodiments, the upper portion of the second metal layer ML2 in the gate trench GT may be removed by an etching process, thereby leaving a lower portion of the second metal layer ML2 in the gate trench GT. The second dummy filler layer 115 may be used as an etch mask to protect the lower portion of the second metal layer ML2 adjacent thereto. The lower portion of the second metal layer ML2 remaining in the gate trench GT may be defined as the second metal pattern MP2.

The upper portion of the second metal layer ML2 in the gate trench GT may be selectively removed using a dry etching process or a wet etching process. An exposed top surface of the second metal pattern MP2 may be curved by the etching process. A level of a top surface of the second dummy filler layer 115 may be the substantially the same as a level of a fourth point TP4 of the exposed top surface TS3 of the second metal pattern MP2, (see FIG. 3A).

In some embodiments, a portion of the gate dielectric layer GL exposed the second metal pattern MP2 may also be etched during the etching process for forming the second metal pattern MP2. Thus, a second depressed region GIb (or a second stepped region GIb) may be formed at the gate dielectric layer GL, (see FIG. 3C).

Figure 15:
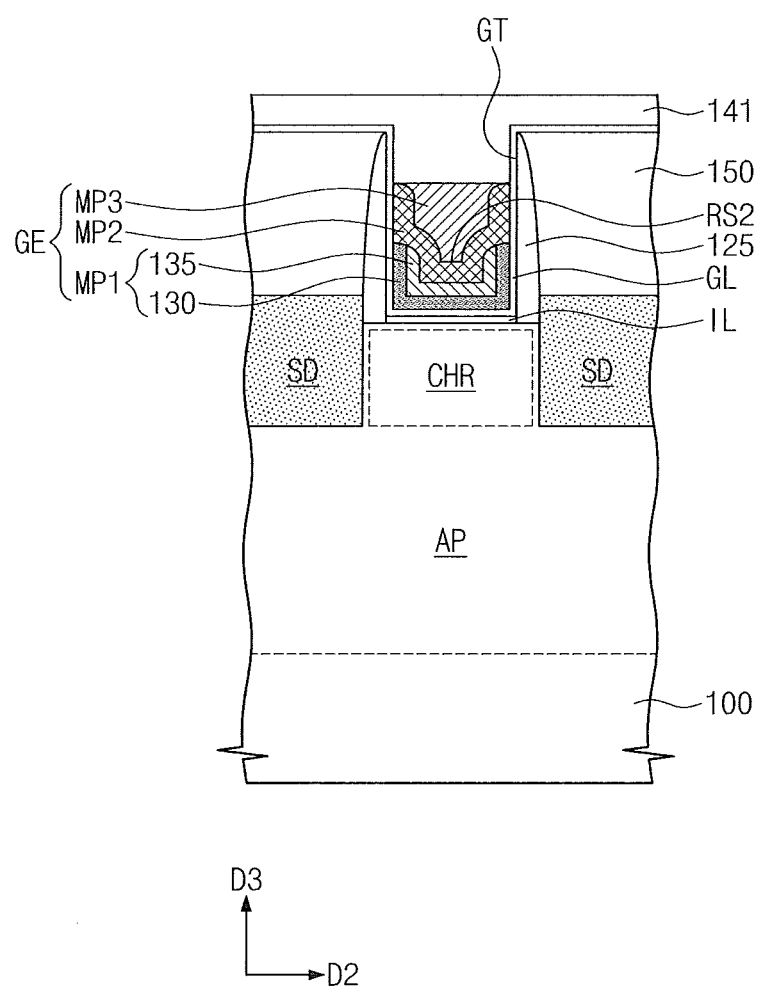

Referring to FIG. 15, a third metal pattern MP3 filling the gate trench GT may be formed on the second metal pattern MP2. Specifically, the second dummy filler layer 115 may be selectively removed. Thus, a second recess region RS2 defined by the second metal pattern MP2 may be exposed. A third metal layer may be formed to completely fill the second recess region RS2 and the gate trench GT. Thereafter, an upper portion of the third metal layer may be removed by a selective etching process. The third metal pattern MP3 may be etched such that a top surface of the third metal pattern MP3 is lower than the top surface of the interlayer insulating layer 150. As a result, the third metal pattern MP3 may be formed in the gate trench GT.

The third metal layer may be formed by a deposition process such as an ALD process, a CVD process, or a sputtering process. The third metal layer may be formed of a low-resistance metal including at least one of Aluminum (Al), Tungsten (W), Titanium (Ti), or Tantalum (Ta).

A protection layer 141 may be formed on the third metal pattern MP3 to completely fill the gate trench GT. The protection layer 141 may be formed by an ALD process, a plasma-enhanced CVD (PECVD) process, or a high-density plasma CVD (HDP CVD) process. The protection layer 141 may be formed of a material having an etch selectivity with respect to the interlayer insulating layer 150. For example, the protection layer 141 may include at least one of SiON, SiCN, SiCON, or SiN.

Referring again to FIG. 1 and FIG. 2, the protection layer 141 and the gate dielectric layer GL may be planarized until the top surface of the interlayer insulating layer 150 is exposed, thereby forming a protection pattern 145 and a gate dielectric pattern GI.

Figure 16:
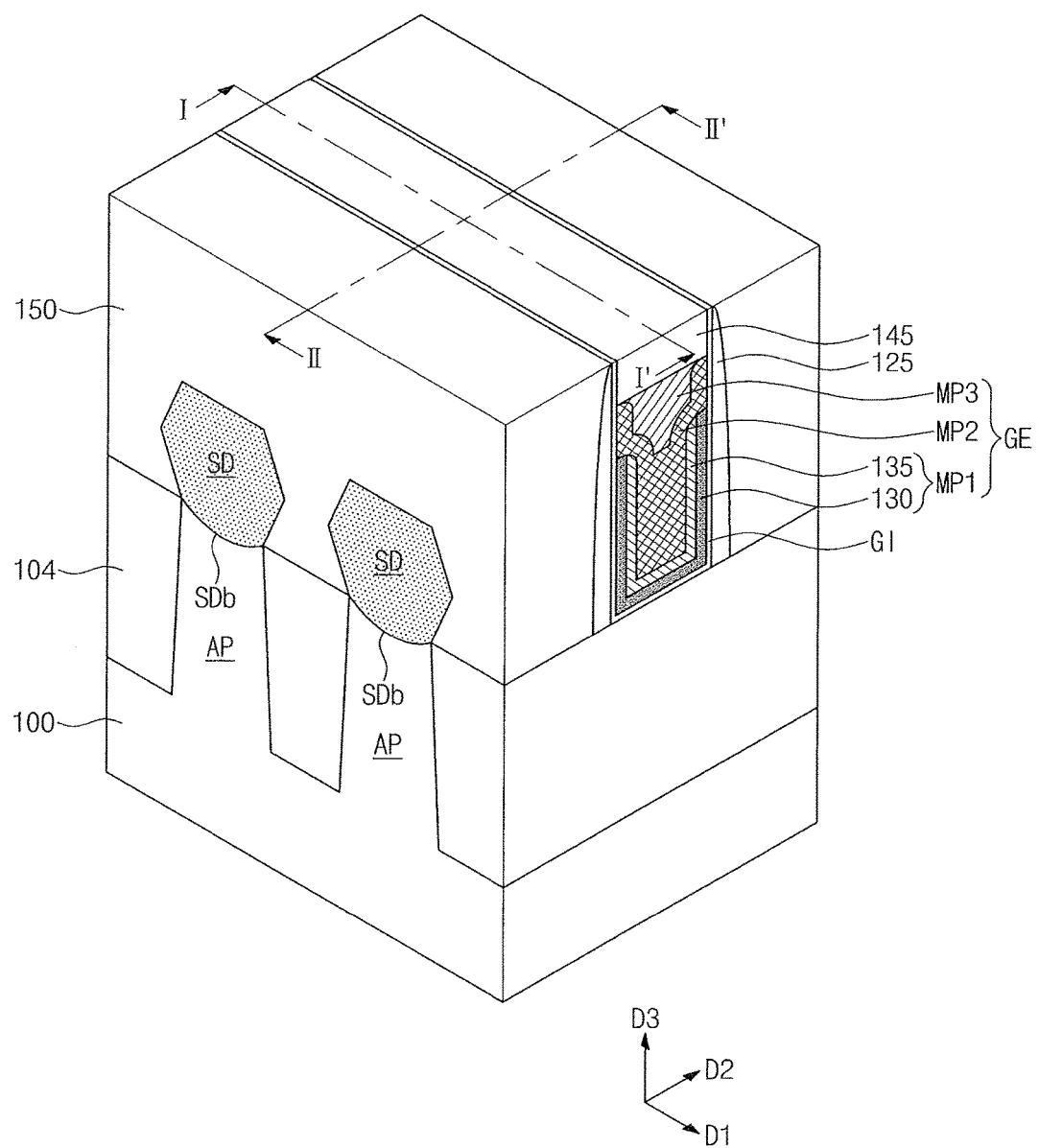
FIG. 16 is a perspective view illustrating a semiconductor device according to embodiments of the inventive concepts.
Figure 17:
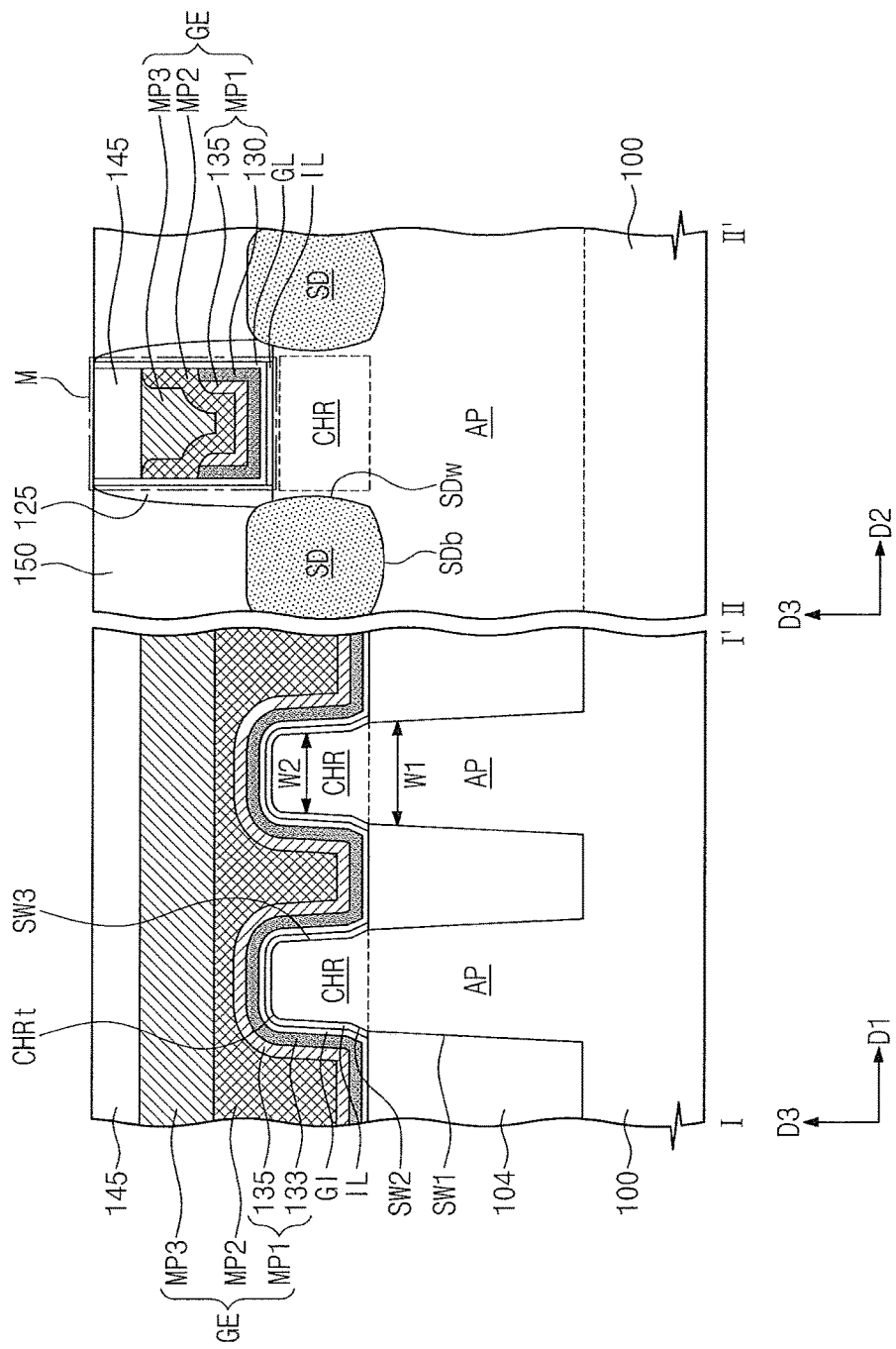
FIG. 17 is a cross-sectional view of FIG. 16 taken along lines I-I' and II-II'.

FIG. 16 is a perspective view illustrating a semiconductor device according to some embodiments of the inventive concepts. FIG. 17 is a cross-sectional view of FIG. 16 taken along lines I-I' and II-II'. In the following embodiments, the descriptions of the same components and technical features as in the embodiment of FIG. 1, FIG. 2, and FIG. 3A will be omitted or mentioned briefly for brevity and clarity of explanation. Instead, differences between the present embodiment and the embodiment of FIG. 1, FIG. 2, and FIG. 3A will be mainly described hereinafter.

Referring to FIG. 16 and FIG. 17, device isolation layers 104 may be disposed in an upper portion of the substrate 100 to define a plurality of active patterns AP. Each of the upper portions of the active patterns AP may include source and drain patterns SD and a channel region CHR disposed between each source and drain pattern SD. A width W1 in a first direction D1 of the active pattern AP, (e.g., a width W1 of a portion of the active pattern AP disposed between the device isolation layers 104) may become progressively narrower towards a top end of each of the active patterns AP (e.g., towards the channel region CHR). In other words, the active pattern AP may have a first sidewall SW1 being in contact with the device isolation layer 104, and the first sidewall SW1 may have a first gradient. The first gradient may be less than 90 degrees.

Each of the channel regions CHR may protrude from the device isolation layers 104 in a third direction D3 perpendicular to a top surface of the substrate 100. A width W2 in the first direction D1 of the channel region CHR may become progressively narrower towards a top surface of the channel region CHR. In other words, the channel region CHR may have a third sidewall SW3 being in contact with an interface pattern IL, and the third sidewall SW3 may have a third gradient. The third gradient may be less than 90 degrees.

The channel region CHR may include a lower portion adjacent to the device isolation layers 104 and an upper portion disposed on the lower portion. A width W2 of the lower portion of the channel region CHR may decrease sharply toward the upper portion of the channel region CHR. In other words, the lower portion of the channel region CHR may have a second sidewall SW2 between the first sidewall SW1 and the third sidewall SW3, and the second sidewall SW2 may have a second gradient. The second gradient may be less than the first gradient. In addition, the second gradient may also be less than the third gradient.

Each of the source and drain patterns SD may have a sidewall SDw being in contact with the channel region CHR. The sidewall SDw may be convex toward the channel region CHR. In addition, the source and drain pattern SD may have a bottom surface SDb that is convex downward.

Figure 18:
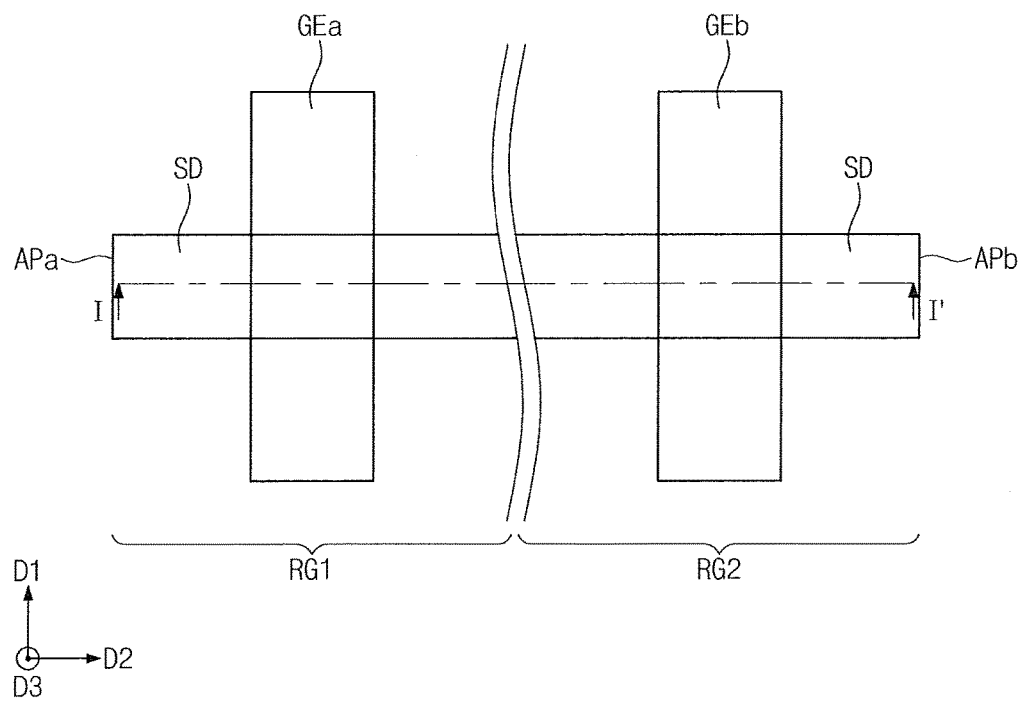
FIG. 18 is a plan view of a semiconductor device according to some embodiments of the inventive concepts.
Figure 19:
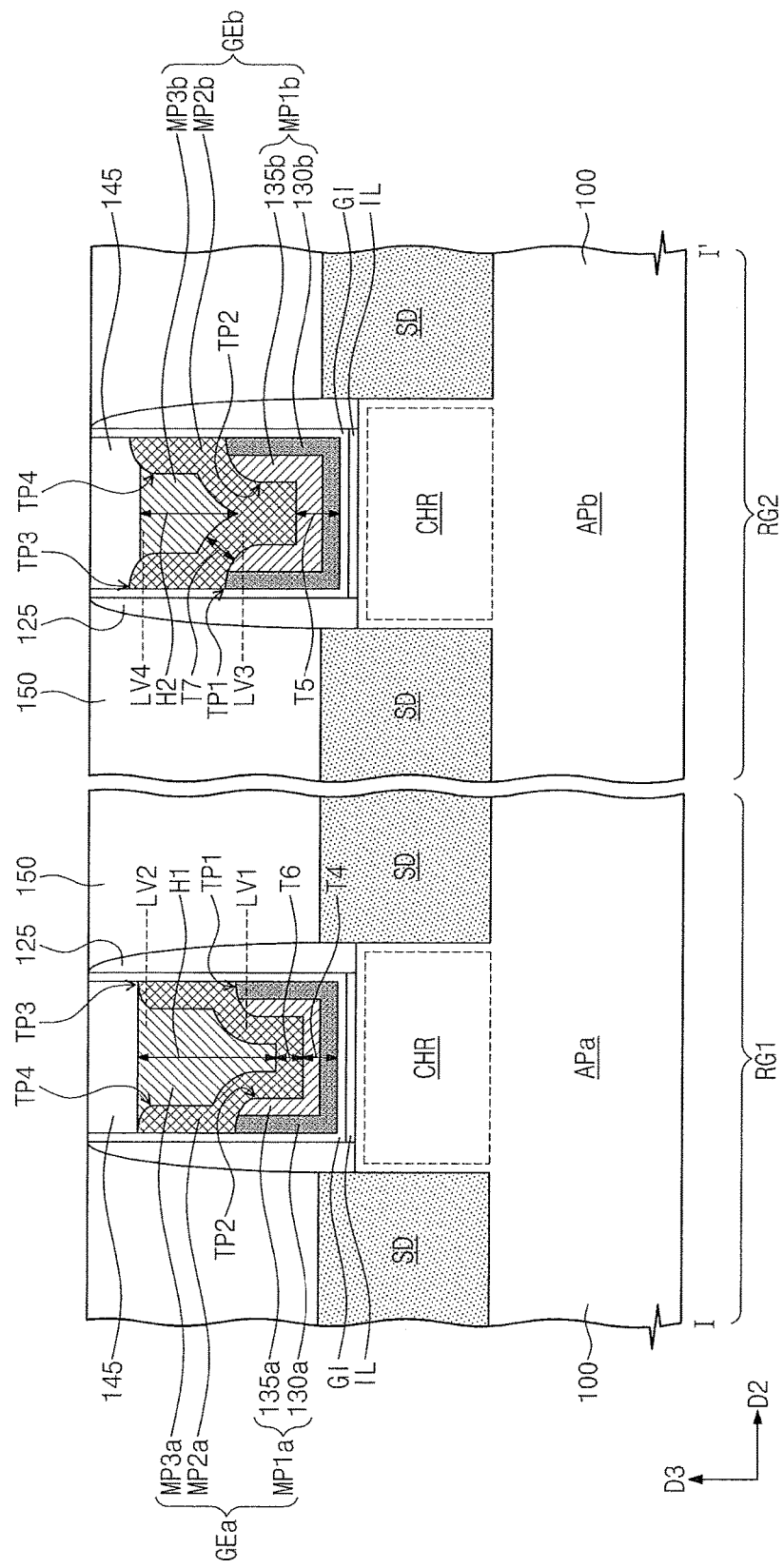
FIG. 19 is a cross-sectional view of FIG. 18 taken along a line I-I'.

FIG. 18 is a plan view of a semiconductor device according to some embodiments of the inventive concepts. FIG. 19 is a cross-sectional view of FIG. 18 taken along a line I-I'. In the following embodiments, the descriptions of the same components and technical features as in the embodiment of FIG. 1, FIG. 2, and FIG. 3A will be omitted or mentioned briefly for brevity and clarity of explanation. Instead, differences between the following embodiments and the embodiment of FIG. 1, FIG. 2, and FIG. 3A will be mainly described hereinafter.

Referring to FIG. 18 and FIG. 19, a substrate 100 including a first region RG1 and a second region RG2 may be provided. At least one first active pattern APa may be defined on the first region RG1, and at least one second active pattern APb may be defined on the second region RG2.

The first and second regions RG1 and RG2 may be connected to each other. In another embodiment, the first and second regions RG1 and RG2 may be spaced apart from each other. In some embodiments, the first and second regions RG1 and RG2 may perform the same function. For example, the first region RG1 may be a portion of a logic region, and the second region RG2 may be another portion of the logic region.

In certain embodiments, the first and second regions RG1 and RG2 may perform functions different from each other. For example, the first region RG1 may be one of a memory region and a non-memory region, and the second region RG2 may be the other of the memory region and the non-memory region. For example, the memory region may include a SRAM region, a DRAM region, a MRAM region, a RRAM region, or a PRAM region, and the non-memory region may include a logic region.

The first and second active patterns APa and APb may be connected to each other to constitute one active pattern. Alternatively, the first and second active patterns APa and APb may be spaced apart from each other. In some embodiments, the first and second active patterns APa and APb may have the same conductivity type. Alternatively, the first and second active patterns APa and APb may have conductivity types different from each other. For example, an APa region may be P-type and the APb region may be N-type.

First and second gate electrodes GEa and GEb may be disposed on the substrate 100 to intersect the first and second active patterns APa and APb, respectively. The widths in a second direction D2 of the first and second gate electrodes GEa and GEb may be substantially equal to each other. The source and drain patterns SD may be disposed in an upper portion of the first active pattern APa on either side of the first gate electrode GEa. The source and drain patterns SD may be disposed in an upper portion of the second active pattern APb on either side of the second gate electrode GEb.

The composition and structure of each of the first and second gate electrodes GEa and GEb may be the same as, or similar to, the composition and structure of the gate electrode GE described above with reference to FIG. 1, FIG. 2, FIG. 3A, and FIG. 3B. Hereinafter, a symbol 'a' is added to the reference designators (or reference numerals) of the composition (e.g. constituents) of the first gate electrode GEa, and a symbol 'b' is added to reference designators (or reference numerals) of the constituents of the second gate electrode GEb.

A first metal pattern MP1a of the first gate electrode GEa may have a fourth thickness T4 in the D3 direction. A first metal pattern MP1b of the second gate electrode GEb may have a fifth thickness T5 in the D3 direction. The fourth thickness T4 may be different from the fifth thickness T5. In some embodiments, the fifth thickness T5 may be greater than the fourth thickness T4. In some embodiments, a second sub-pattern 135a of the first gate electrode GEa may be thinner than a second sub-pattern 135b of the second gate electrode GEb. Conversely, a thickness of a first sub-pattern 130a of the first gate electrode GEa may be substantially equal to a thickness of a first sub-pattern 130b of the second gate electrode GEb.

Referring to FIG. 3A and FIG. 19, a level of a second point TP2 of the first metal pattern MP1a may be substantially the same as a level of a second point TP2 of the first metal pattern MP1b. However, a level of a first point TP1 of the first metal pattern MP1a may be lower than a level of a first point TP1 of the first metal pattern MP1b. In other words, an average level LV1 of a top surface TS1 of the first metal pattern MP1a may be different from an average level LV3 of a top surface TS1 of the first metal pattern MP1b. In some embodiments, the average level LV1 of the top surface TS1 of the first metal pattern MP1a may be lower than the average level LV3 of the top surface TS1 of the first metal pattern MP1b.

A second metal pattern MP2a of the first gate electrode GEa may have a sixth thickness T6. A second metal pattern MP2b of the second gate electrode GEb may have a seventh thickness T7. The sixth thickness T6 may be different from the seventh thickness T7. In some embodiments, the seventh thickness T7 may be greater than the sixth thickness T6.

Referring again to FIG. 3A and FIG. 19, a level of a fourth point TP4 of the second metal pattern MP2a may be substantially the same as a level of a fourth point TP4 of the second metal pattern MP2b. However, a level of a third point TP3 of the second metal pattern MP2a may be lower than a level of a third point TP3 of the second metal pattern MP2b. In other words, an average level LV2 of a top surface TS3 of the second metal pattern MP2a may be different from an average level LV4 of a top surface TS3 of the second metal pattern MP2b. In some embodiments, the average level LV2 of the top surface TS3 of the second metal pattern MP2a may be lower than the average level LV4 of the top surface TS3 of the second metal pattern MP2b.

A third metal pattern MP3a of the first gate electrode GEa may have a first height H1 in a third direction D3. A third metal pattern MP3b of the second gate electrode GEb may have a second height H2 in the third direction D3. Here, the first height H1 may be different from the second height H2. In some embodiments, the first height H1 may be greater than the second height H2. This may be because the thicknesses of the first and second metal patterns MP1a and MP2a of the first gate electrode GEa are different from the thicknesses of the first and second metal patterns MP1b and MP2b of the second gate electrode GEb.

According to some embodiments of the inventive concepts, the width of the first gate electrode GEa may be substantially equal to the width of the second gate electrode GEb. However, the thicknesses and shapes of the first to third metal patterns MP1a to MP3a of the first gate electrode GEa may be different from those of the first to third metal patterns MP1b to MP3b of the second gate electrode GEb. Thus, a threshold voltage of a first transistor including the first gate electrode GEa and the first active pattern APa may be different from a threshold voltage of a second transistor including the second gate electrode GEb and the second active pattern APb. In some embodiments, the first and second transistors may be the same type transistors. In other words, the channel regions of the first and second transistors may have the same conductivity type. In some embodiments, the first and second transistors may be the first type of transistors (e.g., PMOS transistors). In certain embodiments, the first and second transistors may be the second type of transistors (e.g., NMOS transistors). In certain embodiments, one of the first and second transistors may be the first type transistor (e.g., a PMOS transistor), and the other of the first and second transistors may be the second type transistor (e.g., an NMOS transistor). For example, the first transistor and the second transistor may be the NMOS transistor and the PMOS transistor, respectively.

FIG. 20 to FIG. 25 are cross-sectional views of FIG. 18 taken along the line I-I' to illustrate embodiments of the inventive concepts at sequential steps of manufacturing a semiconductor device. In the following embodiments, the descriptions to the same technical features as in the embodiments of FIG. 4A to FIG. 9A, FIG. 4B to FIG. 9B, and FIG. 10 to FIG. 15 will be omitted or mentioned briefly for brevity and clarity of explanation. Instead, differences between the following embodiments and the embodiments of FIG. 4A to FIG. 9A, FIG. 4B to FIG. 9B, and FIG. 10 to FIG. 15 will be mainly described hereinafter.

Figure 20:
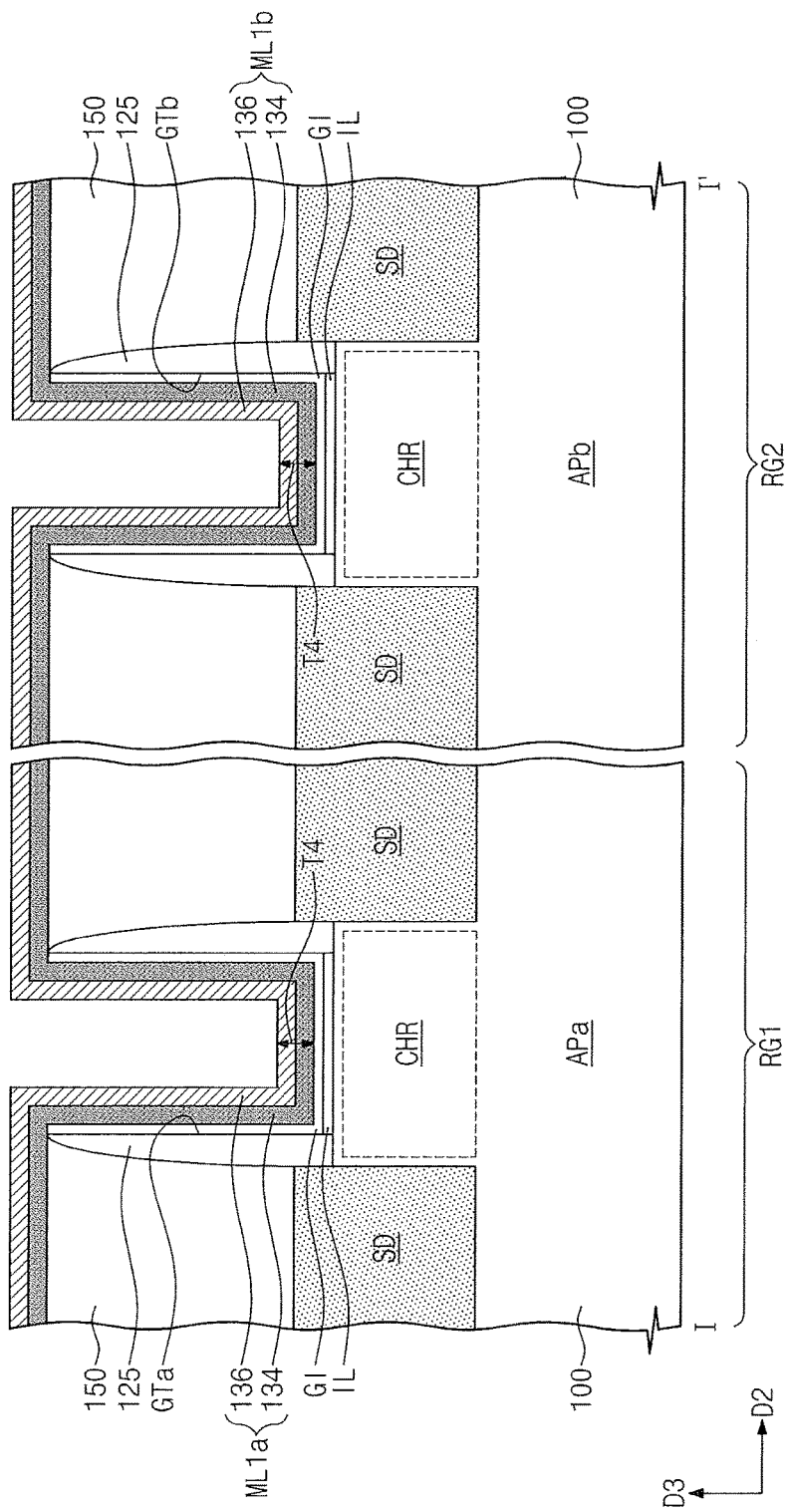
FIG. 20 to FIG. 25 are cross-sectional views of FIG. 18 taken along the line I-I' to illustrate embodiments of the inventive concepts at sequential steps of manufacturing a semiconductor device.

Referring to FIG. 18 and FIG. 20, a first gate trench GTa may be formed on a first region RG1 of a substrate 100, and a second gate trench GTb may be formed on a second region RG2 of the substrate 100. The first and second gate trenches GTa and GTb may be formed by the same method of forming the gate trench GT as described above with reference to FIG. 4A to FIG. 9A and FIG. 4B to FIG. 9B. The first and second gate trenches GTa and GTb may be formed at the same time. The first and second gate trenches GTa and GTb may have substantially the same width in a second direction D2.

Hereinafter, a symbol 'a' is added to reference designators (or reference numerals) of constituents formed in, or on, the first gate trench GTa, and a symbol 'b' is added to reference designators (or reference numerals) of constituents formed in, or on, the second gate trench GTb.

A first metal layer ML1a partially filling the first gate trench GTa and a first metal layer ML1b partially filling the second gate trench GTh may be formed on the substrate 100. The first metal layer ML1a of the first gate trench GTa and the first metal layer ML1b of the second gate trench GTb may be formed at the same time. Thus, a thickness T4 of the first metal layer ML1a of the first gate trench GTa may be substantially equal to a thickness T4 of the first metal layer ML1b of the second gate trench GTb. Forming the first metal layers ML1a and ML1b may include sequentially forming a first sub-metal layer 134 and a second sub-metal layer 136. A method of forming the first metal layer ML1a and ML1b may be the same as the method of forming the first metal layer ML1, described with reference to FIG. 11.

Figure 21:
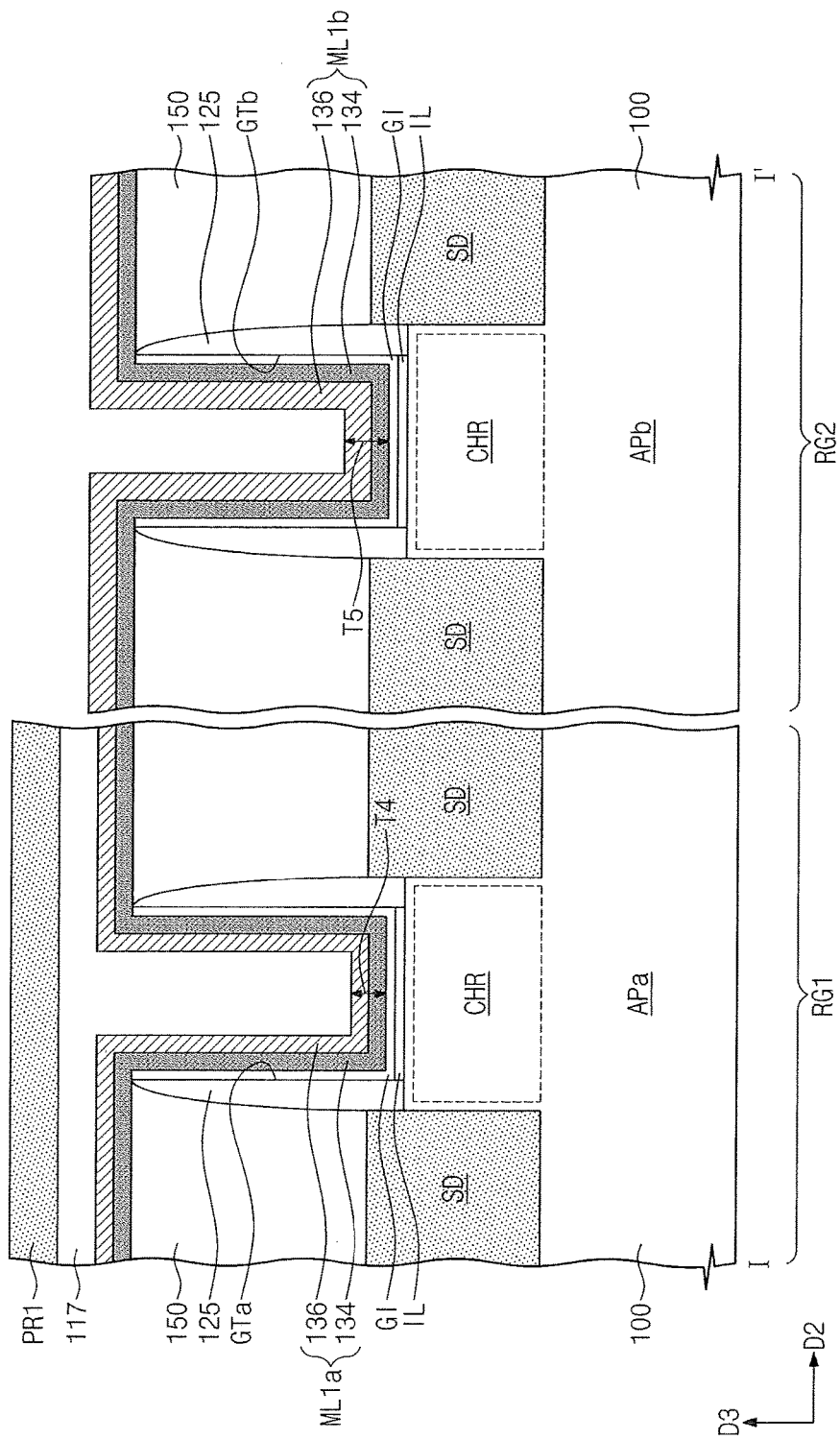

Referring to FIG. 18 and FIG. 21, a first mask layer 117 may be formed to completely fill the first gate trench GTa of the first region RG1. The first mask layer 117 may selectively expose the second region RG2. In other words, the first metal layer ML1*b* in the second gate trench GTh may be completely exposed. The first mask layer 117 may be formed by a patterning process using a first photoresist pattern PR1 selectively covering the first region RG1.

An additional metal material may be deposited on the exposed first metal layer ML1*b* to selectively increase a thickness of the first metal layer ML1*b* in the second gate trench GTb. Thus, a thickness T5 of the first metal layer ML1*b* of the second gate trench GTb may become greater than the thickness T4 of the first metal layer ML1*a* of the first gate trench GTa. In some embodiments, a P-type work function metal material may be additionally deposited on the second sub-metal layer 136 of the first metal layer ML1*b*, thereby increasing a thickness of the second sub-metal layer 136 of the first metal layer ML1*b*. The P-type work function metal material may be the same material as the second sub-metal layer 136 previously deposited, or may be a different material from the second sub-metal layer 136 previously deposited. The thickness of the first metal layer ML1*a* in the first gate trench GTa filled with the first mask layer 117 may be maintained at T4.

Figure 22:
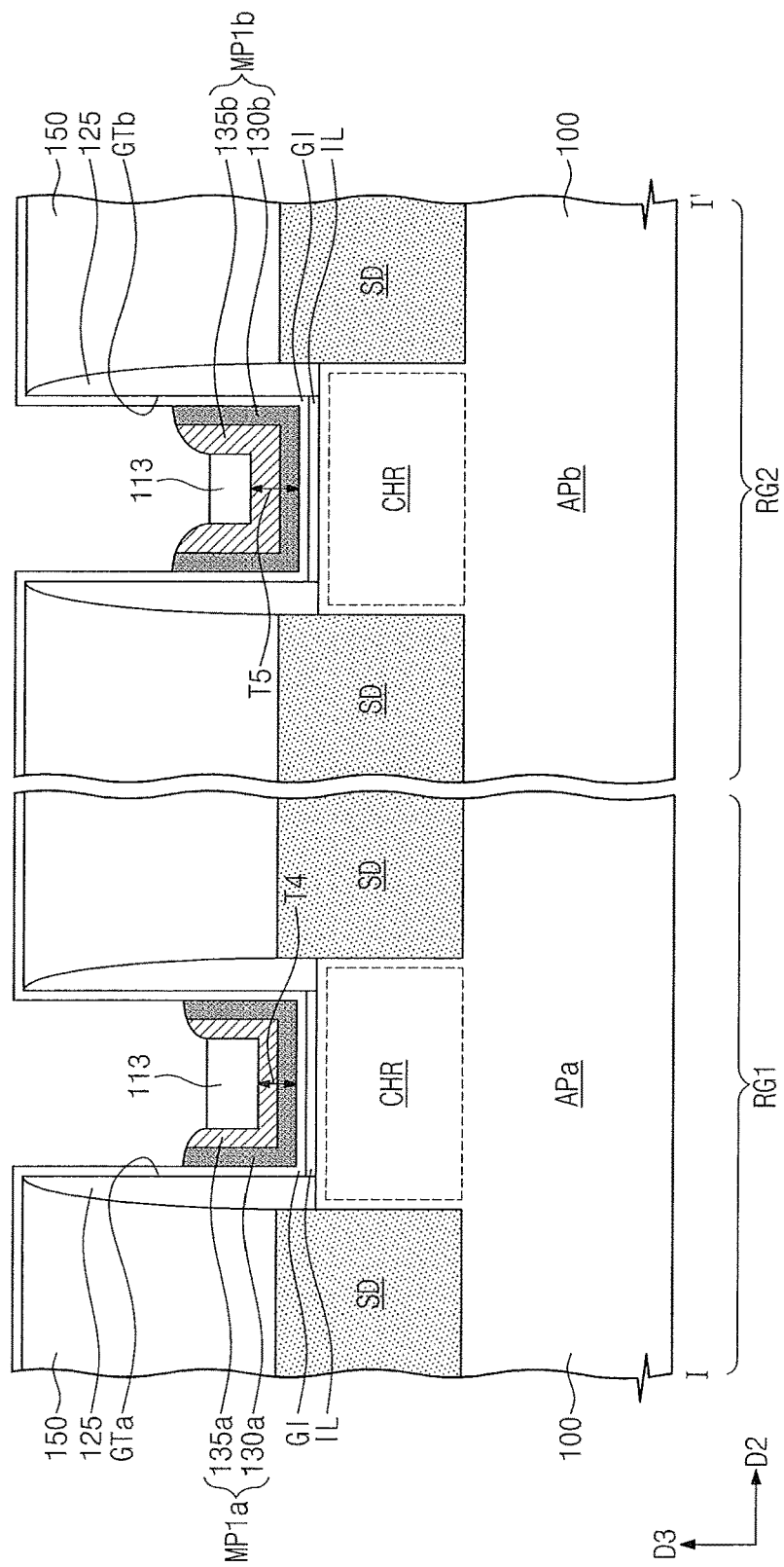

Referring to FIG. 18 and FIG. 22, the first photoresist pattern PR1 and the first mask layer 117 may be removed subsequent to the deposition steps described for FIG. 21. First dummy filler layers 113 may be formed in the first and second gate trenches GTa and GTb, respectively. In some embodiments, the first dummy filler layers 113 may be formed at the same time, and thus the top surfaces of the first dummy filler layers 113 may be disposed at substantially the same level.

Next, an upper portion of the first metal layer ML1*a* in the first gate trench GTa may be removed to form a first metal pattern MP1*a* in the first gate trench GTa. An upper portion of the first metal layer ML1*b* in the second gate trench GTb may be removed to form a first metal pattern MP1*b* in the second gate trench GTb. The method of forming the first dummy filler layers 113 and the first metal patterns MP1*a* and MP1*b* may be the same as described above with reference to FIG. 11 and FIG. 12.

Figure 23:
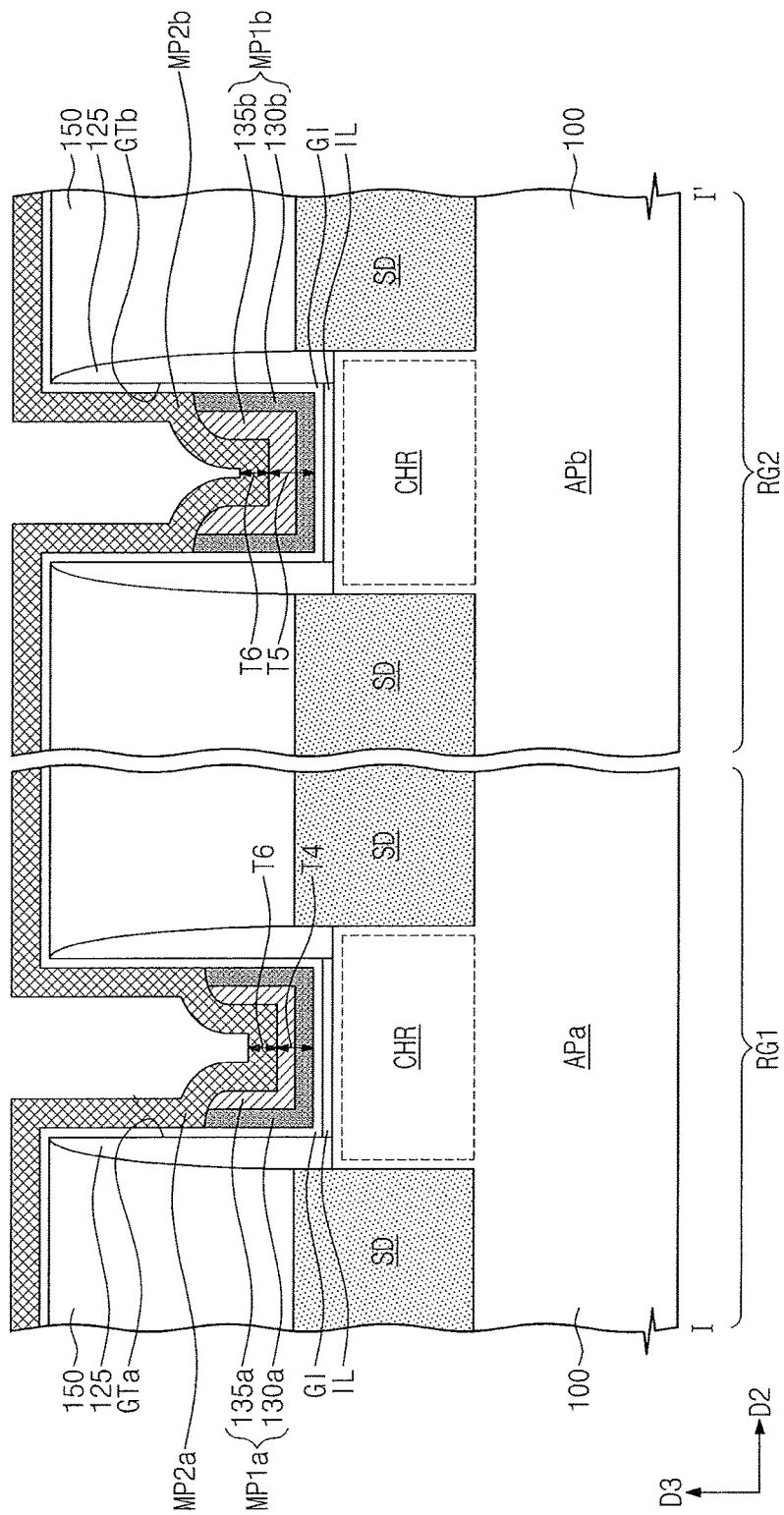

Referring to FIG. 18 and FIG. 23, a second metal layer ML2*a* partially filling the first gate trench GTa and a second metal layer ML2*b* partially filling the second gate trench GTb may be formed on the substrate 100. The first dummy filler layers 113 may be selectively removed before the formation of the second metal layers ML2*a* and ML2*b*. The second metal layer ML2*a* of the first gate trench GTa and the second metal layer ML2*b* of the second gate trench GTh may be formed at the same time. Thus, a thickness T6 of the second metal layer ML2*a* of the first gate trench GTa may be substantially equal to a thickness T6 of the second metal layer ML2*b* of the second gate trench GTh. A method of forming the second metal layer ML2*a* and ML2*b* may be the same as the method of forming the second metal layer ML2, described with reference to FIG. 13.

Figure 24:
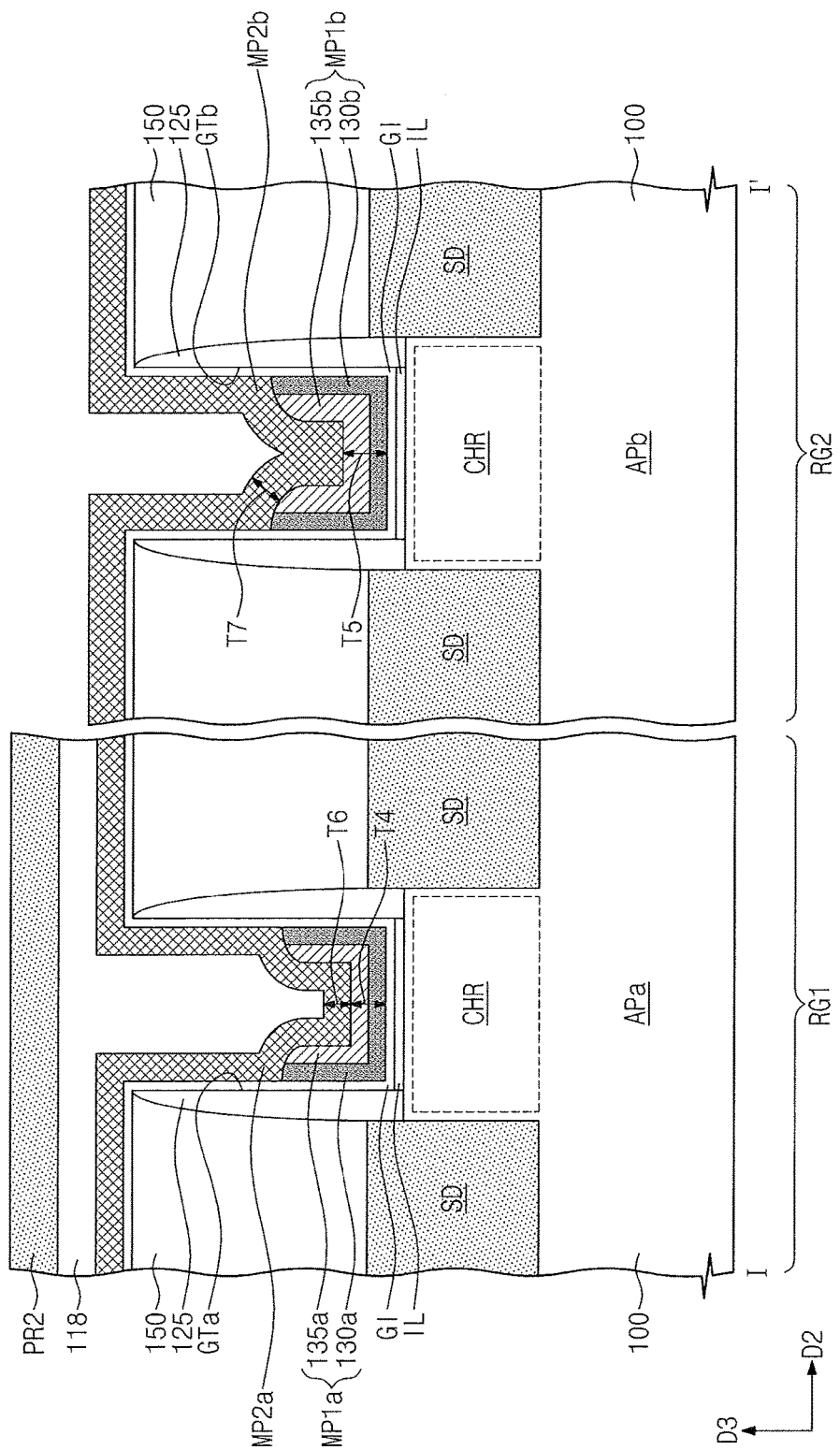

Referring to FIG. 18 and FIG. 24, a second mask layer 118 may be formed to completely fill the first gate trench GTa in a manner similar to that described for FIG. 21. The second mask layer 118 may selectively expose the second region RG2. In other words, the second metal layer ML2*b* in the second gate trench GTh may be completely exposed. The second mask layer 118 may be formed by a patterning process using a second photoresist pattern PR2 selectively covering the first region RG1.

A metal material may be additionally deposited on the exposed second metal layer ML2*b* to selectively increase a thickness of the second metal layer ML2*b* in the second gate trench GTb. Thus, a thickness T7 of the second metal layer ML2*b* of the second gate trench GTh may become greater than the thickness T6 of the second metal layer ML2*a* of the first gate trench GTa. In some embodiments, an N-type work function metal material may be additionally deposited on the second metal layer ML2*b* to increase the thickness of the second metal layer ML2*b*. The N-type work function metal material may be the same material as the second metal layer ML2*b* previously deposited or may be a different material from the second metal layer ML2*b* previously deposited. The thickness of the second metal layer ML2*a* in the first gate trench GTa filled with the second mask layer 118 may be maintained at T6.

Figure 25:
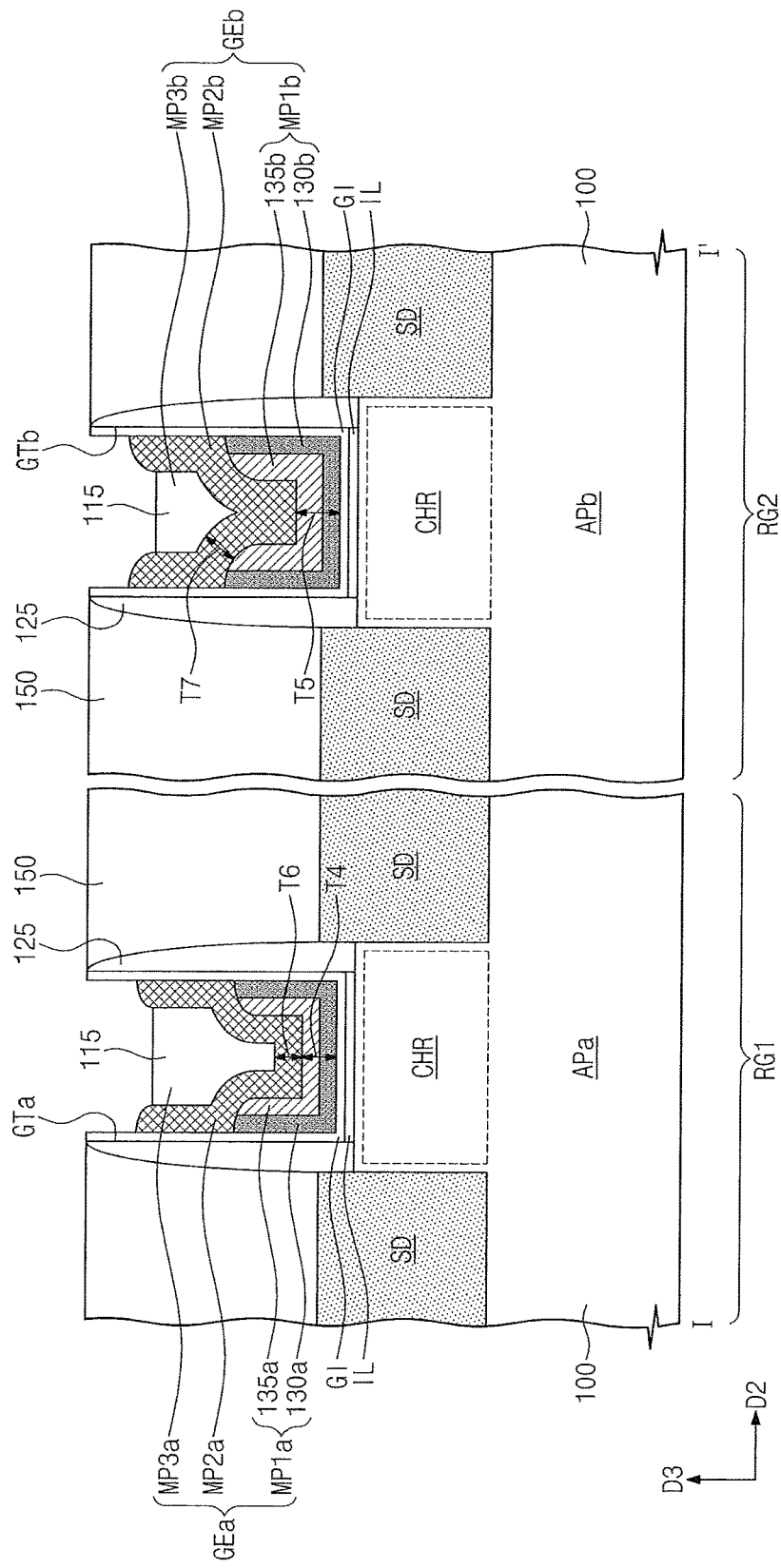

Referring to FIG. 18 and FIG. 25, the second photoresist pattern PR2 and the second mask layer 118 may be removed subsequent to the deposition steps described for FIG. 24. Second dummy filler layers 115 may be formed in the first and second gate trenches GTa and GTb, respectively. In some embodiments, the second dummy filler layers 115 may be formed at the same time, and thus top surfaces of the second dummy filler layers 115 may be disposed at substantially the same level.

Next, an upper portion of the second metal layer ML2*a* in the first gate trench GTa may be removed to form a second metal pattern MP2*a* in the first gate trench GTa. Similarly, an upper portion of the second metal layer ML2*b* in the second gate trench GTb may be removed to form a second metal pattern MP2*b* in the second gate trench GTb. The method of forming the second dummy filler layers 115 and the second metal patterns MP2*a* and MP2*b* may be the same as described above with reference to FIG. 13 and FIG. 14.

Referring again to FIG. 18 and FIG. 19, third metal patterns MP3*a* and MP3*b* may be formed on the second metal patterns MP2*a* and MP2*b* in the first and second gate trenches GTa and GTh, respectively. The second dummy filler layers 115 may be selectively removed before the formation of the third metal patterns MP3*a* and MP3*b*. A method of forming the third metal patterns MP3*a* and MP3*b* may be the same as the method of forming the third metal pattern MP3, described with reference to FIG. 15. Next, protection patterns 145 may be formed on the third metal patterns MP3*a* and MP3*b* to completely fill the first and second gate trenches GTa and GTb, respectively.

Figure 26:
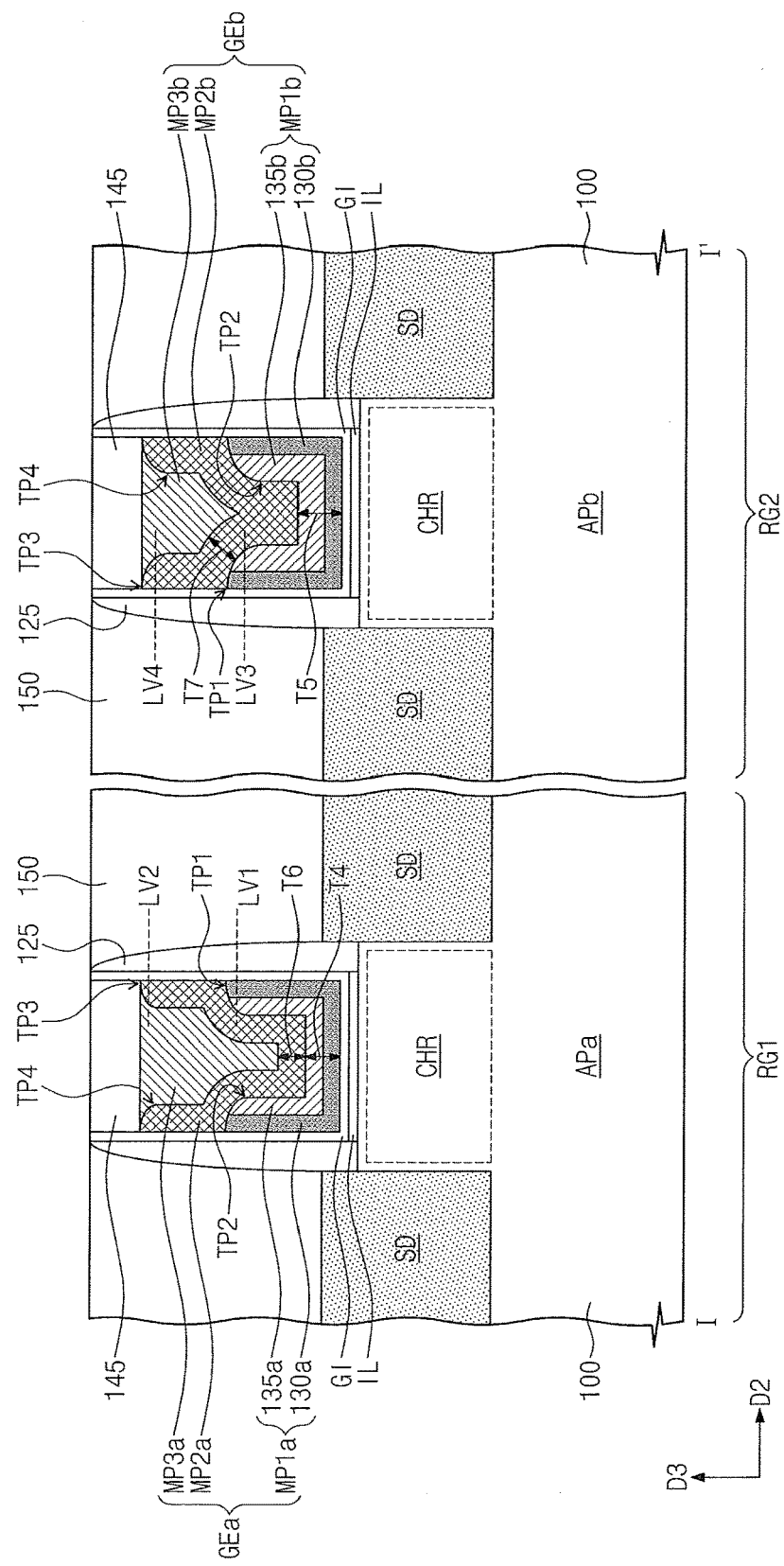
FIG. 26 is a cross-sectional view of FIG. 18 taken along the line I-I' to illustrate a semiconductor device according to embodiments of the inventive concepts.

FIG. 26 is a cross-sectional view of FIG. 18 taken along the line I-I' to illustrate a semiconductor device according to some embodiments of the inventive concepts. In the following embodiments, the descriptions of the same components and technical features as in the embodiment of FIG. 18 and FIG. 19 will be omitted or mentioned briefly for brevity and clarity of explanation. Instead, differences between the following embodiments and the embodiment of FIG. 18 and FIG. 19 will be mainly described hereinafter.

Referring to FIG. 18 and FIG. 26, a level of a first point TP1 of a first metal pattern MP1*a* may be substantially the same as a level of a first point TP1 of a first metal pattern MP1*b*. However, a level of a second point TP2 of the first metal pattern MP1*a* may be higher than a level of a second point TP2 of the first metal pattern MP1*b*. Similarly, an average level LV1 of a top surface TS1 of the first metal pattern MP1*a* may be different from an average level LV3 of a top surface TS1 of the first metal pattern MP1*b*. In some embodiments, the average level LV1 of the top surface TS1 of the first metal pattern MP1a may be higher than the average level LV3 of the top surface TS1 of the first metal pattern MP1b.

A level of a third point TP3 of a second metal pattern MP2a may be substantially the same as a level of a third point TP3 of a second metal pattern MP2b. However, a level of a fourth point TP4 of the second metal pattern MP2a may be higher than a level of a fourth point TP4 of the second metal pattern MP2b. In other words, an average level LV2 of a top surface TS3 of the second metal pattern MP2a may be different from an average level LV4 of a top surface TS3 of the second metal pattern MP2b. In some embodiments, the average level LV2 of the top surface TS3 of the second metal pattern MP2a may be higher than the average level LV4 of the top surface TS3 of the second metal pattern MP2b.

Figure 27:
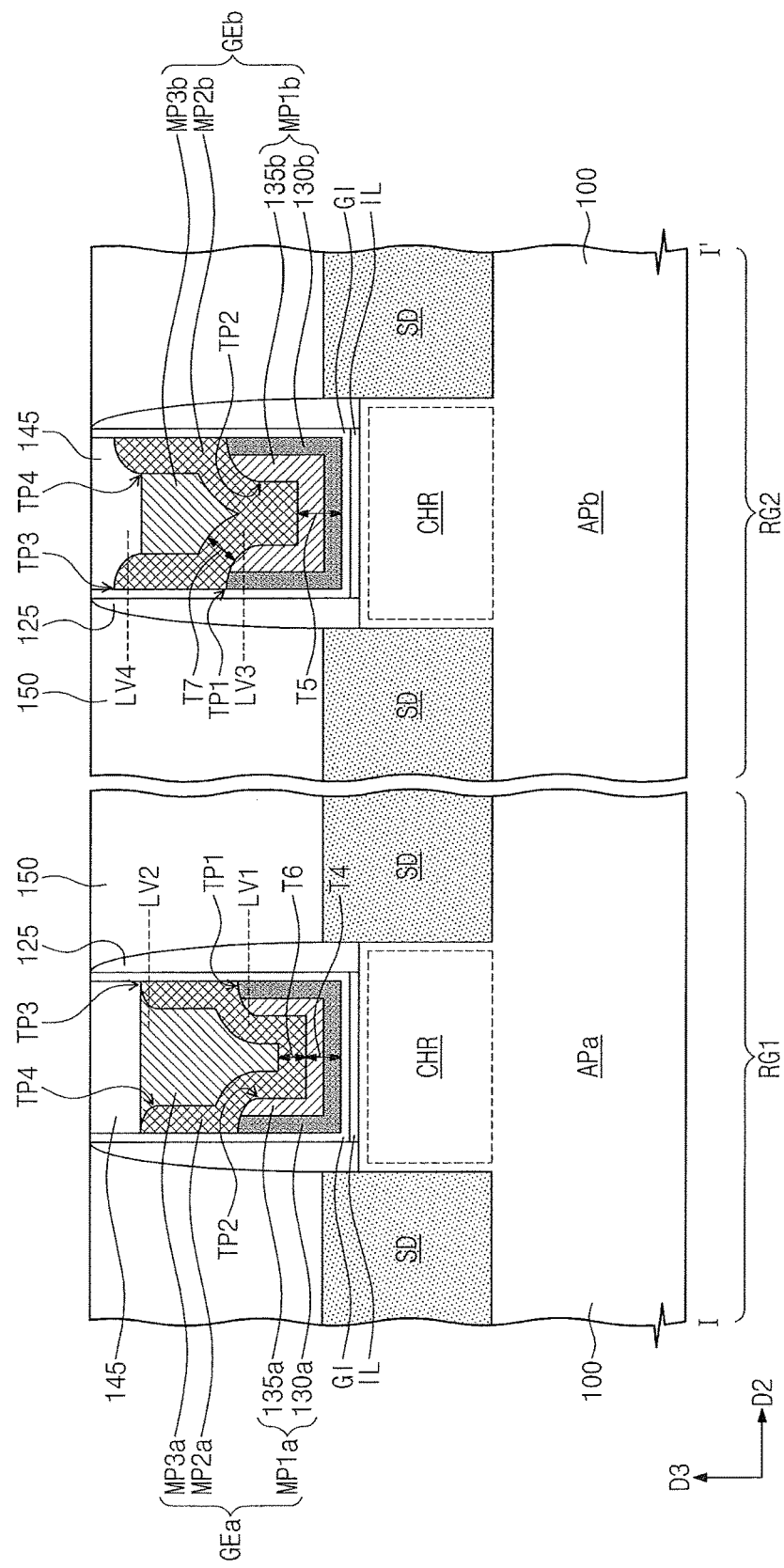
FIG. 27 is a cross-sectional view of FIG. 18 taken along the line I-I' to illustrate a semiconductor device according to embodiments of the inventive concepts.

FIG. 27 is a cross-sectional view of FIG. 18 taken along the line I-I' to illustrate a semiconductor device according to some embodiments of the inventive concepts. In the following embodiments, the descriptions to the same components and technical features as in the embodiment of FIG. 18 and FIG. 19 will be omitted or mentioned briefly for brevity and clarity of explanation. Instead, differences between the present embodiment and the embodiment of FIG. 18 and FIG. 19 will be mainly described hereinafter.

Referring to FIG. 18 and FIG. 27, a level of a first point TP1 of a first metal pattern MP1a may be lower than a level of a first point TP1 of a first metal pattern MP1b. In addition, a level of a second point TP2 of the first metal pattern MP1a may be lower than a level of a second point TP2 of the first metal pattern MP1b. In other words, an average level LV1 of a top surface TS1 of the first metal pattern MP1a may be different from an average level LV3 of a top surface TS1 of the first metal pattern MP1b. In some embodiments, the average level LV1 of the top surface TS1 of the first metal pattern MP1a may be lower than the average level LV3 of the top surface TS1 of the first metal pattern MP1b.

The top surfaces of the first dummy filler layers 113 described above with reference to FIG. 18 and FIG. 22 may be disposed at substantially the same level. Conversely, when the first metal patterns MP1a and MP1b according to the present embodiment are formed, a top surface of a first dummy filler layer 113 formed on a relatively thick first metal layer ML1b may be higher than a top surface of a first dummy filler layer 113 formed on a relatively thin first metal layer ML1a. Thus, the average level LV3 of the top surface TS1 of the first metal pattern MP1b may be higher than the average level LV1 of the top surface TS1 of the first metal pattern MP1a.

However, a level of a third point TP3 of a second metal pattern MP2a may be lower than a level of a third point TP3 of a second metal pattern MP2b. In addition, a level of a fourth point TP4 of the second metal pattern MP2a may be lower than a level of a fourth point TP4 of the second metal pattern MP2b. In other words, an average level LV2 of a top surface TS3 of the second metal pattern MP2a may be different from an average level LV4 of a top surface TS3 of the second metal pattern MP2b. In some embodiments, the average level LV2 of the top surface TS3 of the second metal pattern MP2a may be lower than the average level LV4 of the top surface TS3 of the second metal pattern MP2b.

The top surfaces of the second dummy filler layers 115 described above with reference to FIG. 18 and FIG. 25 may be disposed at the substantially same level. Conversely, when the second metal patterns MP2a and MP2b according to the present embodiment are formed, a top surface of a second dummy filler layer 115 formed on a relatively thick second metal layer ML2b may be higher than a top surface of a second dummy filler layer 115 formed on a relatively thin second metal layer ML2a. Thus, the average level LV4 of the top surface TS3 of the second metal pattern MP2b may be higher than the average level LV2 of the top surface TS3 of the second metal pattern MP2a.

Figure 28:
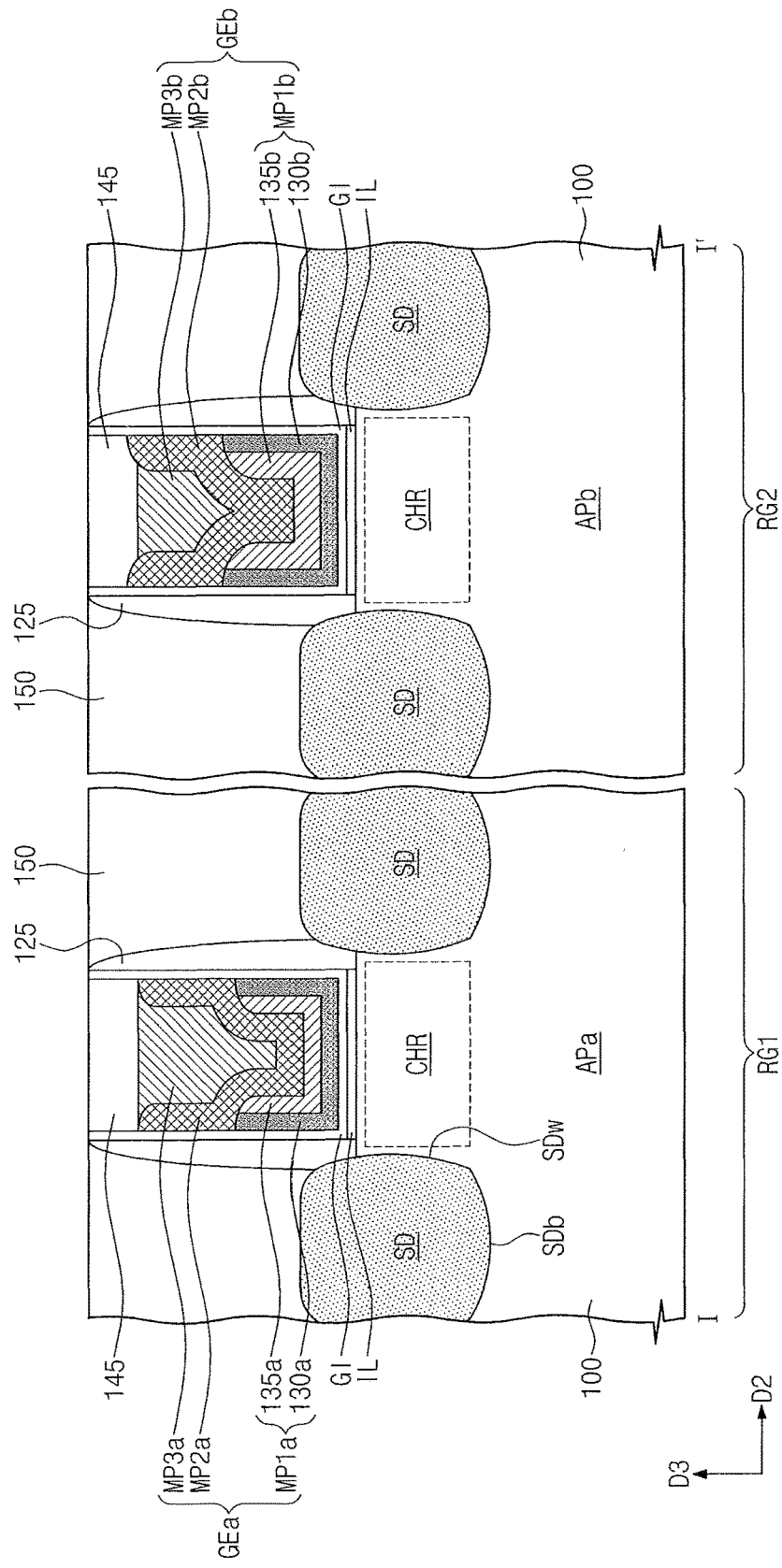
FIG. 28 is a cross-sectional view of FIG. 18 taken along the line I-I' to illustrate a semiconductor device according to embodiments of the inventive concepts.

FIG. 28 is a cross-sectional view of FIG. 18 taken along the line I-I' to illustrate a semiconductor device according to some embodiments of the inventive concepts. In the following embodiments, the descriptions to the same components and technical features as in the embodiment of FIG. 18 and FIG. 19 will be omitted or mentioned briefly for brevity and clarity of explanation. Instead, differences between the following embodiments and the embodiment of FIG. 18 and FIG. 19 will be mainly described hereinafter.

Referring to FIG. 18 and FIG. 28, the source and drain patterns SD may be disposed in an upper portion of each of first and second active patterns APa and APb. Each of the source and drain patterns SD may have a sidewall SDw being in contact with a channel region CHR. The sidewall SDw may be convex toward the channel region CHR. In addition, the source and drain pattern SD may have a bottom surface SDb that is convex downward.

In some embodiments, a first transistor including the first gate electrode GEa and the first active pattern APa may be the same type as a second transistor including the second gate electrode GEb and the second active pattern APb. In other words, the channel regions of the first and second transistors may have the same conductivity type. The source and drain patterns SD of the first and second active patterns APa and APb may be formed of the same material at the same time, and thus the source and drain patterns SD of the first and second active patterns APa and APb may have the substantially same shape.

Figure 29:
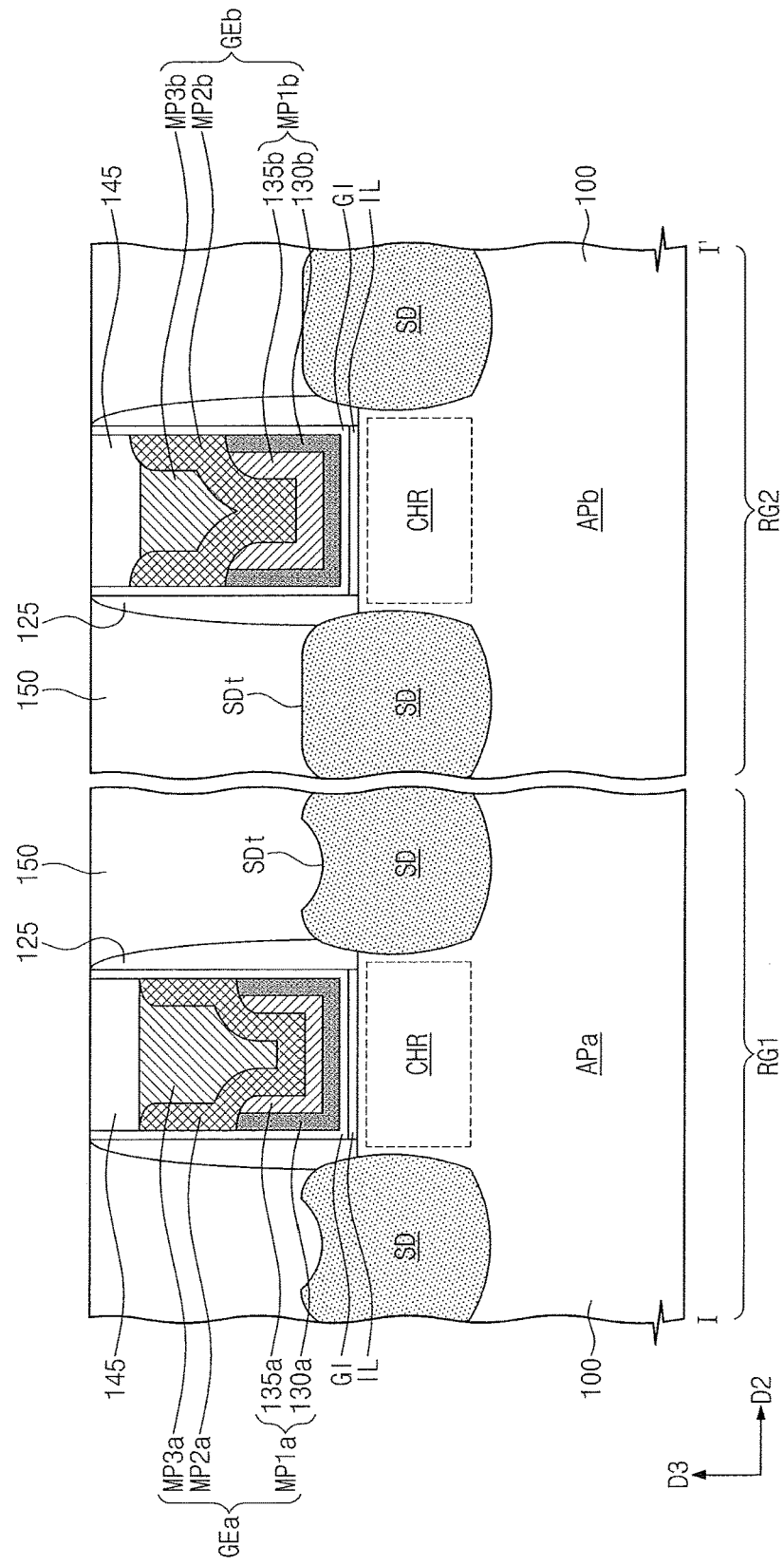
FIG. 29 is a cross-sectional view of FIG. 18 taken along the line I-I' to illustrate a semiconductor device according to embodiments of the inventive concepts.

FIG. 29 is a cross-sectional view of FIG. 18 taken along the line I-I' to illustrate a semiconductor device according to some embodiments of the inventive concepts. In the following embodiments, the descriptions to the same components and technical features as in the embodiment of FIG. 18 and FIG. 28 will be omitted or mentioned briefly for brevity and clarity of explanation. Instead, differences between the present embodiment and the embodiment of FIG. 18 and FIG. 28 will be mainly described hereinafter.

Referring to FIG. 18 and FIG. 29, the source and drain patterns SD may be disposed in an upper portion of each of first and second active patterns APa and APb. In some embodiments, the shapes of the source and drain patterns SD of the first active pattern APa may be different from those of the source/drain patterns SD of the second active pattern APb. In some embodiments, the source and drain pattern SD of the first active pattern APa may have a non-flat top surface SDt. For example, the source and drain pattern SD of the first active pattern APa may have a top surface SDt that is concaved downward. Conversely, the source and drain pattern SD of the second active pattern APb may have a substantially flat top surface SDt.

In some embodiments, a type of a first transistor including the first gate electrode GEa and the first active pattern APa may be different from that of a second transistor including the second gate electrode GEb and the second active pattern APb. For example, the first transistor and the second transistor may be an NMOS transistor and a PMOS transistor, respectively.

The source and drain pattern SD of the first active pattern APa and the source and drain pattern SD of the second active pattern APb may include epitaxial patterns grown using materials from each other. For example, the source and drain pattern SD of the first active pattern APa may be formed using Silicon (Si) or Silicon Carbide (SiC), and the source and drain pattern SD of the second active pattern APb may be formed using Silicon-Germanium (SiGe).

According to some embodiments of the inventive concepts, the thicknesses and shapes of the metal patterns of the gate electrode may be controlled to variously adjust the threshold voltage(s) of the transistor(s) included in the semiconductor device. In addition, the semiconductor device according to the inventive concepts may include the gate electrode that has a fine width and includes the stacked metal patterns.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A semiconductor device comprising:
a substrate having a first active pattern and a second active pattern thereon;
a first gate electrode and a second gate electrode intersecting the first active pattern and the second active pattern, respectively; and
a first spacer and a second spacer on a sidewall of the first gate electrode and a sidewall of the second gate electrode, respectively,
wherein the first and second gate electrodes include first and second metal patterns in lower portions of the first and second gate electrodes, respectively,
the first metal pattern includes a first portion adjacent to the first spacer,
the second metal pattern includes a second portion adjacent to the second spacer,
an average level of a top surface of the first portion is different from an average level of a top surface of the second portion, and
a thickness of the first metal pattern is different from a thickness of the second metal pattern.

2. The semiconductor device of claim 1, wherein the top surface of the first portion has a first point adjacent to the first spacer and a second point adjacent to a center of the first metal pattern,
wherein the top surface of the second portion has a third point adjacent to the second spacer and a fourth point adjacent to a center of the second metal pattern,
the first point is at a higher level than the second point, and
the third point is at a higher level than the fourth point.

3. The semiconductor device of claim 1, wherein a width of the first gate electrode is substantially equal to a width of the second gate electrode.

4. The semiconductor device of claim 1, wherein the first active pattern and the first gate electrode comprise a first transistor,
the second active pattern and the second gate electrode comprise a second transistor, and
a threshold voltage of the first transistor is different than a threshold voltage of the second transistor.

5. The semiconductor device of claim 1, wherein the first gate electrode further comprises: a third metal pattern covering a top surface of the first metal pattern,
the second gate electrode further comprises: a fourth metal pattern covering a top surface of the second metal pattern,
the third metal pattern includes a third portion adjacent to the first spacer,
the fourth metal pattern includes a fourth portion adjacent to the second spacer, and
an average level of a top surface of the third portion is different from an average level of a top surface of the fourth portion.

6. The semiconductor device of claim 5, wherein the first gate electrode further comprises a fifth metal pattern filling a first recess region defined in the third metal pattern,
the second gate electrode further comprises a sixth metal pattern filling a second recess region defined in the fourth metal pattern, and
a height of the fifth metal pattern is different from a height of the sixth metal pattern.

7. A semiconductor device comprising:
a plurality of gates formed on a substrate, each gate including a plurality of metal layers, each metal layer having a center portion parallel to the substrate, the center portion bisecting a pair of side portions orthogonal to the center portion, each of the side portions having a respective top with a taper, a first metal layer separated from the substrate by a gate dielectric, and a second metal layer on the first metal layer;
a first region of the substrate including a first one of the plurality of gates; and
a second region of the substrate including a second one of the plurality of gates,
wherein each of the first metal layer of the first one of the plurality of gates and the first metal layer of the second one of the plurality of gates includes a work function metal pattern consisting of a single layer,
wherein a first thickness of the work function metal pattern of the first metal layer of the first one of the plurality of gates is different from a second thickness of the work function metal pattern of the first metal layer of the second one of the plurality of gates.

8. The semiconductor device of claim 7 wherein the first region includes a NMOSFET region and the second region includes a PMOSFET region.

9. The semiconductor device of claim 7 wherein a third thickness of the second metal layer of the first one of the plurality of gates is thicker than a fourth thickness of the second metal layer of the second one of the plurality of gates.

10. The semiconductor device of claim 7 wherein the first metal layer of at least one of the plurality of gates includes a material with a different work function than the first metal layer of another of the plurality of gates.

11. A semiconductor device comprising:
a substrate having a first active pattern and a second active pattern thereon;
a first gate electrode and a second gate electrode intersecting the first active pattern and the second active pattern, respectively; and
a first spacer and a second spacer on a sidewall of the first gate electrode and a sidewall of the second gate electrode, respectively,
wherein the first gate electrode includes a first metal pattern in a lower portion of the first gate electrode, and a second metal pattern covering a top surface of the first metal pattern,
wherein the second gate electrode includes a third metal pattern in a lower portion of the second gate electrode, and a fourth metal pattern covering a top surface of the third metal pattern, the first and second metal patterns include a first portion and a second portion respectively, the first and second portions adjacent to the first spacer, the third and fourth metal patterns include a third portion and a fourth portion respectively, the third and fourth portions adjacent to the second spacer, an average level of a top surface of the first portion is different from an average level of a top surface of the third portion, and an average level of a top surface of the second portion is different from an average level of a top surface of the fourth portion.

12. The semiconductor device of claim 11, wherein the first gate electrode further comprises a fifth metal pattern filling a first recess region defined in the second metal pattern, the second gate electrode further comprises a sixth metal pattern filling a second recess region defined in the fourth metal pattern, and a height of the fifth metal pattern is different from a height of the sixth metal pattern.

13. The semiconductor device of claim 11, wherein a width of the first gate electrode is substantially equal to a width of the second gate electrode.

14. The semiconductor device of claim 11, a thickness of the first metal pattern is different from a thickness of the third metal pattern.

15. The semiconductor device of claim 11, wherein the top surface of the first portion has a first point adjacent to the first spacer and a second point adjacent to a center of the first metal pattern, wherein the top surface of the third portion has a third point adjacent to the second spacer and a fourth point adjacent to a center of the second metal pattern, the first point is at a higher level than the second point, and the third point is at a higher level than the fourth point.

16. The semiconductor device of claim 11, wherein the first active pattern and the first gate electrode comprise a first transistor, the second active pattern and the second gate electrode comprise a second transistor, and a threshold voltage of the first transistor is different than a threshold voltage of the second transistor.

* * * * *